United States Patent
Tanaka et al.

(10) Patent No.: US 11,104,766 B2
(45) Date of Patent: Aug. 31, 2021

(54) BLOCK COPOLYMER AND METHOD OF PRODUCING SAME, EPOXY RESIN COMPOSITION AND CURED PRODUCT THEREOF, AND SEMICONDUCTOR ENCAPSULATING MATERIAL

(71) Applicant: Toray Industries, Inc., Tokyo (JP)

(72) Inventors: Hiroko Tanaka, Nasushiobara (JP); Yuka Isago, Nagoya (JP); Itaru Asano, Nagoya (JP); Hiroshi Takezaki, Nagoya (JP); Hisashi Miyama, Tokyo (JP); Shiro Honda, Nagoya (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 16/606,902

(22) PCT Filed: May 24, 2018

(86) PCT No.: PCT/JP2018/020011
§ 371 (c)(1),
(2) Date: Oct. 21, 2019

(87) PCT Pub. No.: WO2018/221373
PCT Pub. Date: Dec. 6, 2018

(65) Prior Publication Data
US 2020/0377670 A1    Dec. 3, 2020

(30) Foreign Application Priority Data

May 31, 2017  (JP) .............................. JP2017-108115
Sep. 28, 2017  (JP) .............................. JP2017-188274
Dec. 27, 2017  (JP) .............................. JP2017-250795

(51) Int. Cl.
*C08G 77/46* (2006.01)
*C08G 81/02* (2006.01)
*C08F 299/08* (2006.01)
*C08G 77/38* (2006.01)
*C08G 77/50* (2006.01)
*C08L 71/02* (2006.01)
*C08L 83/12* (2006.01)

(52) U.S. Cl.
CPC .......... *C08G 81/025* (2013.01); *C08F 299/08* (2013.01); *C08G 77/38* (2013.01); *C08G 77/46* (2013.01); *C08G 77/50* (2013.01); *C08L 71/02* (2013.01); *C08L 83/12* (2013.01)

(58) Field of Classification Search
CPC ........ C08G 77/46; C08G 77/50; C08G 77/38; C08L 83/12
See application file for complete search history.

(56) References Cited

U.S. PATENT DOCUMENTS 4,740,533 A * 4/1988 Su ..................... C08F 299/08
                                                   523/106
2008/0171829 A1    7/2008  Haider et al.
2013/0123529 A1    5/2013  Lu et al.

FOREIGN PATENT DOCUMENTS

| JP | 04-359023 | 12/1992 |
|---|---|---|
| JP | 6-172496 | 6/1994 |
| JP | 7-126392 | 5/1995 |
| JP | 8-277322 | 10/1996 |
| JP | 10-182831 | 7/1998 |
| JP | H10-251520 A | 9/1998 |
| JP | 2001-181395 | 7/2001 |
| JP | 2001-240674 | 9/2001 |
| JP | 2008-174749 | 7/2008 |
| JP | 2011-105809 | 6/2011 |
| JP | 2012-036348 | 2/2012 |
| JP | 2013-189490 | 9/2013 |
| JP | 2013-189490 A | 9/2013 |
| JP | 2015-504468 | 2/2015 |
| WO | 02/051939 A1 | 7/2002 |

OTHER PUBLICATIONS

The Extended European Search Report dated Nov. 13, 2020, of counterpart European Application No. 18809216.7.

* cited by examiner

*Primary Examiner* — Kuo Liang Peng
(74) *Attorney, Agent, or Firm* — DLA Piper LLP (US)

(57) ABSTRACT

A polysiloxane-polyalkylene glycol block copolymer is obtained by reacting a polysiloxane (A) having any functional group selected from a carboxylic anhydride group, a hydroxyl group, an epoxy group, a carboxyl group, and an amino group with a polyalkylene glycol (B) having any functional group selected from a carboxylic anhydride group, a hydroxyl group, a carboxyl group, an amino group, an epoxy group, a thiol group, and an isocyanate group, wherein a content of a structure derived from the polysiloxane (A) is 20% by mass or more and 90% by mass or less with respect to 100% by mass of the polysiloxane-polyalkylene glycol block copolymer.

13 Claims, 1 Drawing Sheet

BLOCK COPOLYMER AND METHOD OF PRODUCING SAME, EPOXY RESIN COMPOSITION AND CURED PRODUCT THEREOF, AND SEMICONDUCTOR ENCAPSULATING MATERIAL

TECHNICAL FIELD

This disclosure relates to a block copolymer and a method of producing the same, an epoxy resin composition containing the block copolymer and a cured product thereof, and a semiconductor encapsulating material.

BACKGROUND

Semiconductor encapsulating materials that protect semiconductors from heat and impact are generally composed of an epoxy resin, a curing agent, a filler, and various additives such as a stress relief agent and a flame retardant. In recent years, while the chip size of semiconductor has increased due to high integration, semiconductor packages have been miniaturization and thinning the size contrastly. Hence, the problems of cracking due to thermal shock at the time of package molding and damage to the package due to peeling off the lead frame or chip from the encapsulating resin often occur. From such circumstances, the encapsulating materials of semiconductors of which the operating temperatures are high such as in-vehicle semiconductors and power semiconductors, the use of which will increase more and more in the future, are required to be further improved in low stress properties, fluidity, heat resistance and the like. Under such circumstances, a technique for decreasing the modulus of elasticity of a semiconductor encapsulating material using silicone particles as a stress relief agent has been disclosed (Japanese Patent Laid-open Publication No. 2013-189490).

On the other hand, as a technique of improving the compatibility of the stress relief agent with the matrix resin, an ABA type triblock copolymer in which both ends of silicone are modified with polyalkylene glycol chains (Japanese Patent Laid-open Publication No. 10-182831) and a method in which a glycidyl group is introduced into the ends of a multiblock copolymer composed of silicone with no functional group and polyalkylene glycol are disclosed (Japanese Patent Laid-open Publication No. 4-359023).

The properties of stress relief agents added in semiconductor encapsulating materials are required to be low modulus of elasticity as well as further additional values such as improved fluidity to ameliorate the work efficiency of fabricating semiconductor encapsulating materials and fine dispersion in the matrix resin for an increase in strength.

On the other hand, the ABA type triblock copolymer composed of silicone middle block modified with polyalkylene glycol end-blocks and the copolymer composed of silicone without functional group and polyalkylene glycol have problems such as coarse dispersion in the matrix resin and bleed-out from the cured epoxy resin.

There is thus a need to provide a block copolymer that exhibits high dispersibility in an epoxy resin without impairing heat resistance, suppresses a decrease in fluidity when added to an epoxy resin composition, decreases the stress of a cured epoxy resin to be obtained, and improves the toughness of the cured epoxy resin, is finely dispersed, and also hardly bleeds out.

SUMMARY

We thus provide:

<1> A polysiloxane-polyalkylene glycol block copolymer obtained by reacting a polysiloxane (A) having any functional group selected from a carboxylic anhydride group, a hydroxyl group, an epoxy group, a carboxyl group, and an amino group with a polyalkylene glycol (B) having any functional group selected from a carboxylic anhydride group, a hydroxyl group, a carboxyl group, an amino group, an epoxy group, a thiol group, and an isocyanate group, in which a content of a structure derived from the polysiloxane (A) is 20% by mass or more and 90% by mass or less with respect to 100% by mass of the polysiloxane-polyalkylene glycol block copolymer.

<2> A method of producing a polysiloxane-polyalkylene glycol block copolymer, the method including reacting a polysiloxane (A) having any functional group selected from a carboxylic anhydride group, a hydroxyl group, an epoxy group, a carboxyl group, and an amino group, with a polyalkylene glycol (B) having any functional group selected from a carboxylic anhydride group, a hydroxyl group, a carboxyl group, an amino group, an epoxy group, a thiol group, and an isocyanate group, and, if necessary, a copolymerization component (C) which reacts with a functional group of the polysiloxane (A) and/or a functional group of the polyalkylene glycol (B), in which an amount of the polysiloxane (A) is 20% by mass or more and 90% by mass or less with respect to 100% by mass of a sum of the polysiloxane (A), the polyalkylene glycol (B), and the copolymerization component (C).

<3> An epoxy resin composition containing the polysiloxane-polyalkylene glycol block copolymer and an epoxy resin.

<4> A cured epoxy resin containing the epoxy resin composition being cured.

<5> A semiconductor encapsulating material containing the cured epoxy resin.

The polysiloxane-polyalkylene glycol block copolymer (hereinafter, sometimes a "block copolymer") is a multiblock copolymer having a polysiloxane block having a functional group and is incompatible with an epoxy resin but exhibits excellent flexibility and a polyalkylene glycol block which has a functional group, is compatible with an epoxy resin, and exhibits excellent flexibility, and exhibits both flexibility and favorable dispersibility in an epoxy resin without impairing heat resistance. The block copolymer is homogeneously and finely dispersed in an epoxy resin when blended with an epoxy resin, bleed-out of the block copolymer from the cured epoxy resin to be obtained can be suppressed, and decreased stress and improved toughness of the cured epoxy resin can be achieved. Moreover, a decrease in fluidity caused by the addition of the block copolymer to an epoxy resin is also suppressed. This block copolymer is also useful as various additives such as a surfactant and a resin modifier and is particularly suitable as a stress relief agent for semiconductor encapsulating materials.

DETAILED DESCRIPTION

The polysiloxane-polyalkylene glycol block copolymer is obtained by reacting a polysiloxane (A) having any functional group selected from a carboxylic anhydride group, a hydroxyl group, an epoxy group, a carboxyl group, and an amino group with a polyalkylene glycol (B) having any functional group selected from a carboxylic anhydride group, a hydroxyl group, a carboxyl group, an amino group, an epoxy group, a thiol group, and an isocyanate group. In the block copolymer, the content of a structure derived from the polysiloxane (A) is 20% by mass or more and 90% by mass or less with respect to 100% by mass of the block copolymer.

As the reaction of the polysiloxane (A) having a functional group with the polyalkylene glycol (B) having a functional group, the polysiloxane (A) having a functional group and the polyalkylene glycol (B) having a functional group may directly react with each other to be bonded to each other or the polysiloxane (A) having a functional group and the polyalkylene glycol (B) having a functional group may be bonded to each other via the copolymerization component (C) that reacts with both the component (A) and the component (B).

When the polysiloxane (A) having a functional group and the polyalkylene glycol (B) having a functional group are bonded to each other via the copolymerization component (C), the intended block copolymer can be obtained even when they do not directly react with each other.

Specific examples of when the polysiloxane (A) having a functional group and the polyalkylene glycol (B) having a functional group directly react with each other to be bonded to each other include when the functional group of one of the polysiloxane (A) or the polyalkylene glycol (B) is a carboxylic anhydride group and the functional group of the other is a hydroxyl group, an epoxy group, or an amino group, when the functional group of one of the polysiloxane (A) or the polyalkylene glycol (B) is a hydroxyl group and the functional group of the other is a carboxylic anhydride group, a carboxyl group, an amino group, an epoxy group, or an isocyanate group, when the functional group of one of the polysiloxane (A) or the polyalkylene glycol (B) is an epoxy group and the functional group of the other is a carboxylic anhydride group, a hydroxyl group, a carboxyl group, an amino group, or a thiol group, when the functional group of one of the polysiloxane (A) or the polyalkylene glycol (B) is a carboxyl group and the functional group of the other is a hydroxyl group, an amino group, an epoxy group, a thiol group, or an isocyanate group, when the functional group of one of the polysiloxane (A) or the polyalkylene glycol (B) is an amino group and the functional group of the other is a carboxylic anhydride group, a hydroxyl group, a carboxyl group, an epoxy group, a thiol group, or an isocyanate group, when the functional group of one of the polysiloxane (A) or the polyalkylene glycol (B) is a thiol group and the functional group of the other is a carboxyl group, an amino group, or an epoxy group, and when the functional group of one of the polysiloxane (A) or the polyalkylene glycol (B) is an isocyanate group and the functional group of the other is a carboxyl group, a hydroxyl group, or an amino group.

A carboxyl group is newly generated after the reaction when the functional group of one of the polysiloxane (A) or the polyalkylene glycol (B) is a carboxylic anhydride group and the functional group of the other is a hydroxyl group. A hydroxyl group is newly generated after the reaction when the functional group of one of the polysiloxane (A) or the polyalkylene glycol (B) is an epoxy group and the functional group of the other is a hydroxyl group. The carboxyl group or hydroxyl group newly generated by the reactions contributes to improvement in dispersibility of the block copolymer in an epoxy resin and improvement in heat resistance.

The most preferable generated functional group is carboxyl group from the viewpoint that the block copolymer is fixed to an epoxy resin and bleed-out thereof can be suppressed when being added to the epoxy resin to obtain a cured product.

A plurality of polysiloxanes (A) having different functional groups and/or a plurality of polyalkylene glycols (B) having different functional groups may be reacted with each other.

The functional group of the polysiloxane (A) is preferably a carboxylic anhydride group and/or a hydroxyl group. Among others, a combination in which the functional group of the polysiloxane (A) is a carboxylic anhydride group and the functional group of the polyalkylene glycol (B) is a hydroxyl group or a combination in which the functional group of the polysiloxane (A) is a hydroxyl group and the functional group of the polyalkylene glycol (B) is a carboxylic anhydride group is preferable. This makes it possible to have a great number of carboxyl groups in the block copolymer having a high molecular weight, to improve the dispersibility of the block copolymer in an epoxy resin, and suppress bleed-out of the block copolymer after an epoxy resin being cured. In addition, the reaction proceeds without using an organic solvent to mix raw materials together, a metal catalyst to accelerate the reaction, and the like, and thus side reactions when fabricating a cured epoxy resin and the like can be suppressed. Furthermore, a combination in which the functional group of the polysiloxane (A) is a carboxylic anhydride group and the functional group of the polyalkylene glycol (B) is a hydroxyl group is more preferable since it is possible to conduct the reaction under milder conditions and to suppress side reactions such as gelation.

When the polysiloxane (A) and the polyalkylene glycol (B) are bonded to each other as the functional group of the polysiloxane (A) and the functional group of the polyalkylene glycol (B) directly react with each other, a bond selected from an ester bond, an ether bond, an amide bond, a urethane bond, and a thioester bond is formed by the reaction of the functional groups of the polysiloxane (A) and polyalkylene glycol (B). The bonding site in the block copolymer to be obtained may contain a newly generated carboxyl group and/or hydroxyl group depending on the combination of the functional group of the polysiloxane (A) and the functional group of the polyalkylene glycol (B).

As the polysiloxane (A) having a functional group, it is preferable to use a polysiloxane represented by Formula (1).

(1)

In the formula, n denotes the number of repeating units from 5 to 100. X denotes any functional group selected from a carboxylic anhydride group, a hydroxyl group, an epoxy group, a carboxyl group, and an amino group. The carboxylic anhydride group also includes cyclic carboxylic anhydride groups such as maleic anhydride, phthalic anhydride, and succinic anhydride. In addition, $R^1$ denotes a hydrogen atom, an alkyl group having 1 to 5 carbon atoms, or a phenyl group. $R^2$ denotes a group selected from a single bond, a divalent aliphatic or aromatic hydrocarbon group having 1 to 10 carbon atoms, and a divalent hydrocarbon ether group having 1 to 10 carbon atoms. A single bond means that $R^2$ does not exist but silicon and X are directly bonded to each other. In addition, $R^2$ is preferably butylene, propylene or ethylene and most preferably propylene or ethylene from the viewpoint of improving dispersibility of the block copolymer in an epoxy resin composition. In addition, the bonding position of X with $R^2$ or silicon atom may be any position when X denotes a cyclic carboxylic anhydride group. In addition, the divalent hydrocarbon ether group is preferably a group represented by —$(CH_2)_a$—O—$(CH_2)_b$—, where $1 \leq a+b \leq 10$. All $R^1$s and all $R^2$s and all Xs may be the same as or different from one another, respectively.

$R^1$ in Formula (1) denotes a hydrogen atom, an alkyl group having 1 to 5 carbon atoms, or a phenyl group and does not react with any of X, Y, or the copolymerization component (C). It is not preferable that $R^1$ reacts with any of X, Y, or the copolymerization component (C) since the reaction of X with Y is inhibited or a crosslinking reaction proceeds. In addition, it is not preferable that the chain length of $R^1$ is too long since fluidity is diminished when the block copolymer obtained is added to an epoxy resin. $R^1$ is preferably any of a propyl group, an ethyl group, or a methyl group, more preferably an ethyl group or a methyl group, and most preferably a methyl group. In addition, all $R^1$s may be different from or the same as one another.

The polysiloxane (A) having a functional group is preferably a polyorganosiloxane having a functional group and particularly preferably polydimethylsiloxane having a functional group.

The weight average molecular weight of the polysiloxane (A) having a functional group is not particularly limited, but the lower limit value thereof is preferably 500 or more, more preferably 800 or more, and still more preferably 1,000 or more. In addition, the upper limit value of the weight average molecular weight is preferably 8,000 or less, more preferably 5,000 or less, still more preferably 4,000 or less, and most preferably 3,000 or less. When the weight average molecular weight of the polysiloxane (A) having a functional group is low, the effect on lowering the modulus of elasticity is minor even when the block copolymer obtained is added to an epoxy resin. In addition, when the weight average molecular weight of the polysiloxane (A) having a functional group is high, the polysiloxane (A) having a functional group and the polyalkylene glycol (B) having a functional group undergo phase separation, the reaction does not proceed in a uniform state, and thus the reactivity of the polysiloxane (A) with the polyalkylene glycol (B) having a functional group deteriorates. Moreover, the functional group content in the block copolymer to be obtained decreases, and thus the effect on improving the dispersibility of the block copolymer in the epoxy resin to be described later is diminished. The weight average molecular weight of the polysiloxane (A) having a functional group refers to a weight average molecular weight measured by gel permeation chromatography using tetrahydrofuran (THF) as a solvent and determined in terms of polymethyl methacrylate.

Examples of the polysiloxane (A) having a functional group include X-22-168AS, KF-105, X-22-163A, X-22-163B, X-22-163C, KF-8010, X-22-161A, X-22-161B, KF-8012, X-22-169AS, X-22-169B, X-22-160AS, KF-6001, KF-6002, KF-6003, X-22-1821, X-22-162C, X-22-167B, X-22-167C, X-22-163, KF-6000, PAM-E, KF-8008, X-22-168A, X-22-168B, X-22-168-P5-B, X-22-1660B-3, and X-22-9409 which are commercially available from Shin-Etsu Chemical Co., Ltd. and BY16-871, BY16-853U, BY16-855, BY16-750, and BY16-201 which are commercially available from Dow Corning Toray Co., Ltd.

In addition, the polyalkylene glycol (B) having a functional group, it is preferable to use a polyalkylene glycol represented by Formula (2).

(2)

In the formula, m denotes the number of repeating units from 3 to 300. Y denotes any functional group selected from a carboxylic anhydride group, a hydroxyl group, a carboxyl group, an amino group, an epoxy group, a thiol group, and an isocyanate group. The carboxylic anhydride group also includes cyclic carboxylic anhydride groups such as maleic anhydride, phthalic anhydride, and succinic anhydride. $R^3$ denotes a linear or branched alkyl group having 2 to 10 carbon atoms. When the number of carbon atoms in $R^3$ is more than 10, the polyalkylene glycol (B) having a functional group is not compatible with an epoxy resin, and the dispersibility of the block copolymer to be obtained with an epoxy resin is poor, thus the strain at break of the cured epoxy resin obtained by mixing and curing these decreases and the toughness improving effect attained by the addition of the block copolymer is diminished. In addition, it is not preferable that $R^3$ has a small number of carbon atoms since the flexibility is diminished. The preferred number of carbon atoms in $R^3$ is 3 or 4. All $R^3$s and all Ys may be the same as or different from one another, respectively.

As the polyalkylene glycol (B) having a functional group, polytetramethylene glycol in which Y denotes a hydroxyl group and $R^3$ denotes a linear butylene group and/or polypropylene glycol in which $R^3$ denotes a branched propylene group are preferable since these exhibit excellent reactivity with the polysiloxane (A) having a functional group, the reaction proceeds without using a metal catalyst as a reaction accelerator, and the polysiloxane (A) and the polyalkylene glycol (B) can react with each other without using an organic solvent to obtain a homogeneous block copolymer when the functional group of the polysiloxane (A) is a carboxylic anhydride group. Polytetramethylene glycol is more preferable particularly from the viewpoint of improving heat resistance.

The weight average molecular weight of the polyalkylene glycol (B) having a functional group is not particularly limited, but the lower limit value thereof is preferably 300 or more, more preferably 500 or more, and still more preferably 1,000 or more. In addition, the upper limit value of the weight average molecular weight is preferably 20,000 or less, more preferably 10,000 or less, still more preferably 5,000 or less, and most preferably 3,000 or less. When the weight average molecular weight of the polyalkylene glycol (B) having a functional group is low, the toughness improving effect when the block copolymer to be obtained is added to an epoxy resin is minor. In addition, when the weight average molecular weight of the polyalkylene glycol (B) having a functional group is high, the polysiloxane (A) having a functional group and the polyalkylene glycol (B) having a functional group undergo phase separation, the reaction does not proceed in a uniform system, and thus the reactivity of the polyalkylene glycol (B) with the polysiloxane (A) having a functional group deteriorates. Moreover, the functional group content in the block copolymer to be obtained decreases, and thus an excellent effect of improving the dispersibility of the block copolymer in an epoxy resin is diminished. The weight average molecular weight of the polyalkylene glycol (B) having a functional group refers to a weight average molecular weight measured by gel permeation chromatography using tetrahydrofuran (THF) as a solvent and determined in terms of polymethyl methacrylate.

In addition to the polysiloxane (A) and the polyalkylene glycol (B), a copolymerization component (C) capable of reacting with these may be further added and reacted in a range in which the flexibility of the block copolymer to be obtained and favorable adhesive property to an epoxy resin are not impaired The copolymerization component (C) is a molecule having one or more functional groups which react with the functional group of the polysiloxane (A) and/or the functional group of the polyalkylene glycol (B). In this example, the block copolymer to be obtained has a structure derived from the copolymerization component (C) in addition to a structure derived from the polysiloxane (A) and a structure derived from the polyalkylene glycol (B).

It is preferable that this copolymerization component (C) is dissolved in both the polysiloxane (A) and the polyalkylene glycol (B) at the time of the reaction since the reaction is likely to proceed. In addition, plural kinds of copolymerization components (C) may be used.

Particularly when the copolymerization component (C) has two or more functional groups and the molecular weight is 2,000 or less, we found that the block copolymer to be obtained has a higher molecular weight as compared to when only the polysiloxane (A) and the polyalkylene glycol (B) are reacted although the reason is unclear. The number of functional groups of the copolymerization component (C) may be two or more, but the three-dimensional crosslinking reaction proceeds and the flexibility is diminished when the number is three or more, and thus it is preferable that the number of functional groups to react with the polysiloxane (A) and/or the polyalkylene glycol (B) is two. In addition, the reactivity is diminished when an increase in viscosity during the reaction is too great, thus it is more preferable as the molecular weight of the copolymerization component (C) is lower, and the molecular weight is preferably 1,500 or less, more preferably 1,000 or less, still more preferably 800 or less, particularly preferably 600 or less, and most preferably 500 or less.

On the other hand, the molecular weight of the block copolymer to be obtained decreases as the amount of the copolymeration component (C) added increases when the copolymerization component (C) has one functional group.

The copolymerization component (C) is preferably one of which the reaction proceeds even without using a metal catalyst as a reaction accelerator and with which the reaction system is uniformly mixed. Examples thereof include mono- or di-carboxylic anhydrides, diols, alcohols, and phenols when the functional group of the polysiloxane (A) is a carboxylic anhydride group and the functional group of the polyalkylene glycol (B) is a hydroxyl group.

Specific examples of the dicarboxylic anhydrides include carboxylic dianhydrides containing aromatic rings such as pyromellitic dianhydride, 4,4'-oxydiphthalic anhydride, 3,3',4,4'-biphenyltetracarboxylic dianhydride, 2,2'-dimethyl-3,3',4,4'-biphenyltetracarboxylic dianhydride, 5,5'-dimethyl-3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenone tetracarboxylic dianhydride, 2,2',3,3'-benzophenone tetracarboxylic dianhydride, 2,3,3',4'-benzophenonetetracarboxylic dianhydride, 3,3',4,4'-diphenylsulfonetetracarboxylic dianhydride, 2,3,3',4'-diphenylsulfonetetracarboxylic dianhydride, 3,3',4,4'-diphenyl sulfoxide tetracarboxylic dianhydride, 3,3',4,4'-diphenyl sulfide tetracarboxylic dianhydride, 3,3',4,4'-diphenylmethylenetetracarboxylic dianhydride, 4,4'-isopropylidene diphthalic dianhydride 4,4'-(4,4'-isopropylidenediphenoxy) diphthalic anhydride, 4,4'-(hexafluoroisopropylidene)diphthalic dianhydride, 3,4,9,10-perylenetetracarboxylic dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,3",4,4"-para-terphenyltetracarboxylic dianhydride, 3,3",4,4"-meta-terphenyltetracarboxylic dianhydride, 2,3,6,7-anthracenetetracarboxylic dianhydride, 1,2,7,8-phenanthrenetetracarboxylic dianhydride, and diol bis (trimellitic dianhydrides) such as ethylene glycol bis (trimellitic dianhydride) and hexane glycol bis(trimellitic dianhydride) and carboxylic dianhydrides containing aliphatic chains such as 1,2,3,4-butanetetracarboxylic acid, 2,3,5-tricarboxycyclopentylacetic acid dianhydride, 1,2,3,4-cyclobutanetetracarboxylic dianhydride, 1,2,3,4-cyclopentanetetracarboxylic dianhydride, 1,2,3,5-cyclopentanetetracarboxylic dianhydride, 1,2,4,5-bicyclohexanetetracarboxylic dianhydride, 1,2,4,5-cyclohexanetetracarboxylic dianhydride, bicyclo[2.2.2]oct-7-ene-2,3,5,6-tetracarboxylic dianhydride, meso-butane-1,2,3,4-tetracarboxylic dianhydride, 5-(2,5-dioxotetrahydrofuryl)-3-methyl-3-cyclohexene-1,2-dicarboxylic anhydride, 4-(2,5-dioxotetrahydrofuran-3-yl)-1,2,3,4-tetrahydronaphthalene-1,2-dicarboxylic anhydride, 1,2,3,4-tetramethyl-1,2,3,4-cyclobutanetetracarboxylic dianhydride, ethylenediaminetetraacetic dianhydride, and diethylenetriaminepentaacetic dianhydride.

When the functional group of the polysiloxane (A) is a carboxylic anhydride group and the polyalkylene glycol (B) is polytetramethylene glycol and when the functional group of the polysiloxane (A) is a hydroxyl group and the polyalkylene glycol (B) is polypropylene glycol, as the copolymerization component (C), at least one selected from pyromellitic dianhydride, 3,3',4,4'-benzophenonetetracarboxylic dianhydride, 4,4'-(4,4'-isopropylidenediphenoxy) diphthalic anhydride, 4,4'-oxydiphthalic anhydride, and 3,3',4,4'-biphenyltetracarboxylic dianhydride is preferable since these are dissolved in the polysiloxane (A) and polytetramethylene glycol or polypropylene glycol and have a low molecular weight and thus the reactivity increases. Among these, pyromellitic dianhydride is preferable from the viewpoint that this is easily dissolved in the polysiloxane (A) and the polyalkylene glycol (B), the system is thus in a uniform state, and the reaction proceeds even without using a metal catalyst as a reaction accelerator.

Specific examples of the monocarboxylic anhydrides include succinic anhydride, phthalic anhydride, maleic anhydride, acetic anhydride, propionic anhydride, oxalic anhydride, and benzoic anhydride. When the functional group of the polysiloxane (A) is a carboxylic anhydride group and the polyalkylene glycol (B) is polytetramethylene glycol, at least one selected from succinic anhydride, phthalic anhydride, and maleic anhydride is preferable from the viewpoint that these are dissolved in the polysiloxane (A) and the polytetramethylene glycol and the reactivity is thus improved.

Examples of the diols include ethylene glycol, 1,2-propylene glycol, 1,3-propylene glycol, 1,2-butanediol, 1,3- butanediol, 1,4-butanediol, 1,5-pentanediol, 1,8-octanediol, 1,9-nonanediol, 1,4-cyclohexanediol, and diethylene glycol. In such hydrocarbon-based alcohols, it is more preferable as the molecular chain is longer since the flexibility of the block copolymer to be obtained is not impaired.

Examples of the alcohols include methanol, ethanol, isopropyl alcohol, butanol, pentanol, hexanol, octanol, dodecanol, tetradecanol, hexadecanol, and octadecanol. When the functional group of the polysiloxane (A) is a carboxylic anhydride group and the polyalkylene glycol (B) is polytetramethylene glycol, at least one selected from octanol and dodecanol is preferable from the viewpoint that they are dissolved in the polysiloxane (A) and polytetramethylene glycol and the reactivity is thus improved.

Examples of the phenols include phenol, bisphenol A, dibutylhydroxytoluene, cresol, eugenol, guaiacol, thymol, methyl salicylate, and propofol.

The amount of the copolymerization component (C) added is not particularly limited, but it is more preferable as the amount is smaller since the physical properties of the block copolymer are not affected. The upper limit thereof is preferably 40% by mass or less, more preferably 30% by mass or less, still more preferably 20% by mass or less, and most preferably 10% by mass or less with respect to 100% by mass of the block copolymer. It is not preferable that the amount added is greater than this range since the flexibility of the block copolymer to be obtained is impaired, also the curing reaction of the block copolymer with an epoxy resin is accelerated as the unreacted copolymerization component (C) exists, and the fluidity is diminished or the toughness improving effect is diminished.

When the polysiloxane (A) having a functional group and the polyalkylene glycol (B) having a functional group do not directly react with each other, a method may be used in which the copolymerization component (C) (hereinafter sometimes "copolymerization component (C')") that reacts with both the functional group of the polysiloxane (A) and the functional group of the polyalkylene glycol (B) is added and the polysiloxane (A), the polyalkylene glycol (B), and the copolymerization component (C') are reacted with one another. In other words, a block copolymer can be obtained by reacting the copolymerization component (C') with both the polysiloxane (A) and the polyalkylene glycol (B) even without directly reacting the polysiloxane (A) and the polyalkylene glycol (B) with each other.

In this example, it is most preferable that polypropylene glycol in which $R^3$ denotes a branched propylene group is used as the polyalkylene glycol (B) since the polysiloxane (A) having a functional group and the polyalkylene glycol (B) can be homogeneously mixed together only using the raw materials and can be uniformly copolymerized. In addition, polypropylene glycol is preferable as the polyalkylene glycol (B) since the block copolymer to be obtained is more favorably and finely dispersed in an epoxy resin and the effect of lowering the modulus of elasticity is more favorable. We believe that the polysiloxane (A) as a block component and polypropylene glycol can be homogeneously mixed together, thus in the block copolymer to be obtained, the properties of the polysiloxane (A) inferior in compatibility with an epoxy resin are ameliorated by polypropylene glycol exhibiting favorable compatibility with an epoxy resin, as a result, fine dispersion of the block copolymer in an epoxy resin is possible and a decrease in modulus of elasticity is more remarkably exerted. When both the functional group of the polysiloxane (A) and the functional group of the polyalkylene glycol (B) are a hydroxyl group, it is preferable to use a compound in which both ends are carboxylic anhydride groups as the copolymerization component (C') from the point of obtaining the block copolymer containing a carboxyl group without using a metal catalyst as a reaction accelerator which causes a side reaction.

The copolymerization component (C') is not particularly limited as long as it is one that reacts with both the polysiloxane (A) having a functional group and the polyalkylene glycol (B) having a functional group among those exemplified as the copolymerization component (C), but is preferably any carboxylic anhydride selected from pyromellitic dianhydride, 3,3',4,4'-benzophenonetetracarboxylic dianhydride, 4,4'-(4,4'-isopropylidenediphenoxy)diphthalic anhydride, 4,4'-oxydiphthalic anhydride, and 3,3',4,4'-biphenyltetracarboxylic dianhydride from the viewpoint that the reaction can proceed without using an organic solvent. Pyromellitic dianhydride is most preferable from the viewpoint that flexibility can be imparted to the block copolymer to be obtained and copolymerization can be conducted without using an organic solvent. Two or more copolymerization components (C') may be used.

The content of a structure derived from the copolymerization component (C') in the block copolymer is preferably 30% by mass or less with respect to 100% by mass of the block copolymer. It is not preferable that the content of a structure derived from the copolymerization component (C') is great since the effect on lowering the modulus of elasticity of the block copolymer is impaired. It is not preferable that the content is small since the block copolymer is not finely dispersed but bleed-out thereof occurs. The content is preferably 25% by mass or less, more preferably 20% by mass or less, particularly preferably 15% by mass or less, and most preferably 10% by mass or less.

The polysiloxane-polyalkylene glycol block copolymer is preferably a multiblock copolymer containing a structure represented by Formula (3).

n denotes the number of repeating units from 5 to 100, m denotes the number of repeating units from 3 to 300, and p denotes the number of repeating units from 5 to 100. In addition, $R^1$s denote a hydrogen atom, an alkyl group having 1 to 5 carbon atoms, or a phenyl group, and may be the same as or different from one another. Z denotes a bonding site to be formed by the reaction of the polysiloxane (A) having a functional group with the polyalkylene glycol (B) having a functional group. When the polysiloxane (A) and the polyalkylene glycol (B) directly react with each other to be bonded to each other, the residue obtained by the reaction of the X of the polysiloxane (A) with the Y of the polyalkylene glycol (B) is the bonding site Z. In addition, when the polysiloxane (A) and the polyalkylene glycol (B) do not directly react with each other but are bonded to each other via the copolymerization component (C'), the residue obtained by the reaction of the X of the polysiloxane (A) and the Y of the polyalkylene glycol (B) with the copolymerization component (C') is the bonding site Z. As a result of this reaction, the bonding site Z has any bond selected from an ester bond, an ether bond, an amide bond, a urethane bond, and a thioester bond. Furthermore, when a carboxyl group and/or a hydroxyl group is newly generated as a result of this reaction, Z also contains the carboxyl group and/or the hydroxyl group. In addition, all Zs may be the same as or different from one another. $R^2$ denotes a group selected from a single bond, a divalent aliphatic or aromatic hydrocarbon group having 1 to 10 carbon atoms, and a divalent hydrocarbon ether group having 1 to 10 carbon atoms. $R^2$s may be the same as or different from one another. $R^3$s denote a linear or branched alkyl group having 2 to 10 carbon atoms, and may be the same as or different from one another. Examples of preferred $R^1$, $R^2$, and $R^3$ are as described above.

The multiblock copolymer is one in which the number of repeating units p is 2 or more and preferably 5 or more. AB type diblock copolymers and ABA type triblock copolymers in which p is 1 are not called multiblock copolymers.

The block copolymer has the functional group of the polysiloxane (A) and the functional group copolymerization component of the polyalkylene glycol (B) described above in the block copolymer and further has a functional group newly generated by the reaction of the polysiloxane (A) and the polyalkylene glycol (B) in some examples and thus has a higher functional group content in any range from a low molecular weight to a high molecular weight as compared to a copolymer having functional groups only at both ends. The block copolymer can contain a great number of functional groups particularly even when having a high molecular weight and thus exhibits excellent dispersibility in an epoxy resin, bleed-out of the block copolymer from a cured epoxy resin is suppressed, and a high effect of diminishing the stress and improving the toughness is attained. In addition to the above properties, the block copolymer having a weight average molecular weight and a functional group amount within the following preferred ranges can maintain the fluidity in an epoxy resin composition, exhibit improved heat resistance, and can suppress a decrease in glass transition temperature Tg and an increase in coefficient of linear expansion of a cured epoxy resin to be obtained.

The weight average molecular weight ($M_w$) of the block copolymer is not particularly limited, but the lower limit value thereof is preferably 5,000 or more, more preferably 10,000 or more, more preferably 15,000 or more, still more preferably 20,000 or more, and particularly preferably 30,000 or more from the viewpoint of mechanical properties and fluidity of a cured epoxy resin to which the block copolymer is added. In addition, the upper limit thereof is preferably 500,000 or less, more preferably 200,000 or less, more preferably 150,000 or less, still more preferably 100,000 or less, and most preferably 80,000 or less. When the weight average molecular weight is lower than this range, the effect of lowering the modulus of elasticity and improving the toughness of a cured epoxy resin to which the block copolymer is added is diminished. It is not preferable that the weight average molecular weight is higher than this range since the fluidity of an epoxy resin composition added to an epoxy resin is diminished, the epoxy resin composition cannot penetrate into the fine portions at the time of molding of the encapsulating material, and cracking is caused.

The weight average molecular weight of the block copolymer refers to a weight average molecular weight measured by gel permeation chromatography using tetrahydrofuran (THF) as a solvent and determined in terms of polymethyl methacrylate.

Dimethylformamide is used as a solvent when the weight average molecular weight cannot be measured using tetrahydrofuran (THF), and hexafluoroisopropanol is used when the weight average molecular weight cannot be still measured using dimethylformamide.

In addition, the molecular weight distribution ($M_w/M_n$) of the block copolymer is preferably 5 or less, more preferably 3 or less, and still more preferably 2 or less. In addition, the lower limit value thereof is 1. The molecular weight distribution ($M_w/M_n$) is calculated from the weight average molecular weight ($M_w$) and number average molecular weight ($M_n$) measured as described above by gel permeation chromatography.

The block copolymer preferably has a functional group content of 0.1 mmol/g or more and 3.0 mmol/g or less. The lower limit value thereof is more preferably 0.2 mmol/g or more and still more preferably 0.3 mmol/g or more. In addition, the upper limit value thereof is more preferably 3.0 mmol/g or less, still more preferably 2.8 mmol/g or less, and particularly preferably 2.5 mmol/g or less.

It is not preferable that the functional group content is higher than this range since deterioration in fluidity due to a side reaction with the epoxy resin and a decrease in heat resistance due to the functional group occur when an epoxy resin composition is fabricated. It is not preferable that the functional group content is lower than this range since the dispersibility of the block copolymer in an epoxy resin is diminished and coarse dispersion of the block copolymer in an epoxy resin composition and a cured product and bleed-out of the block copolymer from the cured epoxy resin occur.

The functional group content is the sum of all the contents of a functional group derived from the polysiloxane (A) having a functional group, a functional group derived from the polyalkylene glycol (B) having a functional group, a functional group derived from the copolymerization component (C), and a functional group newly generated by the reaction of these in the block copolymer. When the block copolymer contains only a carboxyl group as a functional group, the content of the carboxyl group is the functional group content. Moreover, when the block copolymer contains plural functional groups including a carboxyl group and a hydroxyl group, the sum of the respective functional group contents is the functional group content in the block copolymer. It is preferable to adopt a combination in which a carboxyl group or a hydroxyl group is newly generated by the reaction of the polysiloxane (A) and the polyalkylene glycol (B) since it is easy to increase the functional group content, the dispersibility of the block copolymer is favorable, the toughness is improved, and bleed-out is suppressed.

The functional group content can be determined by known titrimetry. For example, in quantifying a carboxyl group, the block copolymer is dissolved in toluene or tetrahydrofuran and titration is conducted with 0.1 mol/L alcoholic potassium hydroxide using phenolphthalein as an indicator. Moreover, an epoxy group can be quantified by a method conforming to JIS K 7236 in quantifying an epoxy group, and a hydroxyl group can be quantified by a method conforming to JIS K 0070 in quantifying a hydroxyl group.

Furthermore, it is possible to adjust the functional group content before and after synthesizing the block copolymer depending on the intended application. It is possible to adjust the functional group content in the block copolymer to be obtained, for example, by adjusting the weight average molecular weights of the polysiloxane (A) having a functional group and/or the polyalkylene glycol (B) having a functional group as raw materials.

It is also possible to adjust the functional group content by protecting a part of the functional groups of the block copolymer after synthesis by a known method. For example, when the functional group in the block copolymer is a carboxyl group, examples thereof include a method in which an esterification reaction is conducted by conducting heating while reducing pressure in the presence of a monovalent alcohol and an acid catalyst and a method in which the carboxyl group is protected using N,N-dimethylformamide dialkylacetal as exemplified in Japanese Patent Laid-open Publication No. 2000-119520. Among these, the method in which the carboxyl group is protected using N,N-dimethylformamide dialkylacetal is most useful from the viewpoint that the treatment can be conducted under mild conditions without using a metal catalyst.

The block copolymer has an effect such that bleed-out thereof from a cured epoxy resin does not occur as described above. Presence or absence of bleed-out of the block copolymer from a cured epoxy resin can be judged by the following method. As a simple confirmation method, an ultrathin section of a cured epoxy resin is fabricated and the ultrathin section is impregnated with hexane for 15 minutes and then observed under a scanning electron microscope. When bleed-out has occurred, the part at which the block copolymer was present is extracted with hexane and becomes a cavity, and perfect spherical irregularities are observed. We determined that bleed-out has occurred when irregularities are observed, and we determined that bleed-out has not occurred when irregularities are not observed. As a quantitative confirmation method, we determined that bleed-out has occurred when the cured epoxy resin is immersed in chloroform for 1 day, then the mass of the block copolymer dissolved in chloroform is measured, and the mass of the block copolymer dissolved in chloroform is 5% by mass or more with respect to the mass of the block copolymer in the cured epoxy resin calculated from the composition and we determined that bleed-out has not occurred when the mass of the block copolymer dissolved is less than 5% by mass. It is more preferable as bleed-out less occurs from the viewpoint of improving the quality as well as lowering the modulus of elasticity and improving the toughness of the cured epoxy resin. The bleed-out is preferably 3% by mass or less, more preferably 2% by mass or less, and still more preferably 1% by mass or less.

As the content of a structure derived from the polysiloxane (A) in the block copolymer, the lower limit value thereof is 20% by mass or more and more preferably 30% by mass or more with respect to 100% by mass of the entire block copolymer. In addition, the upper limit value thereof is 90% by mass or less, more preferably 80% by mass or less, and still more preferably 70% by mass or less. When the content of a structure derived from the polysiloxane (A) is too low, the effect of lowering the modulus of elasticity by the addition of the block copolymer is not sufficiently exerted and the function as a stress decreasing agent is not sufficient even when a block copolymer is added to an epoxy resin to fabricate a cured product. In addition, when the content of a structure derived from the polysiloxane (A) is too high, the dispersibility of the block copolymer in an epoxy resin is not sufficient when being added to the epoxy resin, the block copolymer is not finely dispersed, thus the toughness improving effect by the addition of the block copolymer is not sufficiently exerted even when the epoxy resin is cured to fabricate a cured product. Alternatively, bleed-out is caused and a cured epoxy resin cannot be obtained.

The block copolymer has an effect of not impairing the heat resistance while exhibiting improved dispersibility in an epoxy resin. The heat resistance can be evaluated by measuring the thermal decomposition temperature of the block copolymer. Specifically, the block copolymer is subjected to measurement using an apparatus for thermogravimetry (TGA), and the temperature when the mass is decreased by 5% by mass with respect to the mass at 30° C. is evaluated as the 5% weight loss temperature. The heat resistance is superior as this 5% weight loss temperature is higher. The 5% weight loss temperature is preferably 250° C. or more, more preferably 280° C. or more, still more preferably 300° C. or more, most preferably 350° C. or more, and remarkably preferably 400° C. or more. It is not preferable that the 5% weight loss temperature is less than 250° C. since the polymer is decomposed during the operation of semiconductor to cause damage to the package in some instances when the block copolymer is used as a stress relief agent.

The block copolymer can be produced by reacting the polysiloxane (A) having a functional group with the polyalkylene glycol (B) having a functional group. Examples of the reaction method include a method in which the polysiloxane (A) having a functional group and the polyalkylene glycol (B) having a functional group are mixed together and heated for reaction, and the reaction may be conducted in an organic solvent if necessary. Moreover, the reaction may be conducted in a nitrogen atmosphere if necessary, and the reaction may be conducted under reduced pressure to accelerate the reaction.

In addition, the mixing ratio between the polysiloxane (A) having a functional group and the polyalkylene glycol (B) having a functional group can be appropriately adjusted but is preferably a mixing ratio so that the stoichiometric equivalent ratio is 0.1 to 10 when the polysiloxane (A) having a functional group and the polyalkylene glycol (B) having a functional group directly react with each other to be bonded to each other. The stoichiometric equivalent ratio refers to the ratio of the number of moles of functional groups contained in the polyalkylene glycol (B) to the number of moles of functional groups contained in the polysiloxane (A). The equivalence ratio is more preferably 0.2 to 5, still more preferably 0.5 to 3, most preferably 0.8 to 1.5, and remarkably preferably 1 particularly from the viewpoint of increasing the weight average molecular weight of the block copolymer to be obtained.

On the other hand, when the polysiloxane (A) having a functional group and the polyalkylene glycol (B) having a functional group do not directly react with each other but are bonded to each other as the copolymerization component (C') reacts with the polysiloxane (A) having a functional group and the polyalkylene glycol (B) having a functional group, the equivalent ratio of the number of moles of functional groups contained in the copolymerization component (C') to the total number of moles of functional groups contained in the polysiloxane (A) and the polyalkylene glycol (B) having a functional group is more preferably 0.2 to 5, still more preferably 0.5 to 3, most preferably 0.8 to 1.5, and remarkably preferably 1.

To set the content of a structure derived from the polysiloxane (A) contained in 100% by mass of the block copolymer to be obtained to 20% by mass or more and 90% by mass or less, it is preferable that the raw materials are mixed together and reacted so that the amount of the polysiloxane (A) is 20% by mass or more and 90% by mass or less with respect to 100% by mass of the sum of the polysiloxane (A), the polyalkylene glycol (B), and the copolymerization component (C).

In using an organic solvent in the reaction, the organic solvent is preferably a good solvent for the polysiloxane (A)

having a functional group and the polyalkylene glycol (B) having a functional group. Examples thereof include hydrocarbon-based solvents such as toluene, xylene, benzene, and 2-methylnaphthalene; ester-based solvents such as ethyl acetate, methyl acetate, butyl acetate, butyl propionate, butyl butyrate, and ethyl acetoacetate; halogenated hydrocarbon-based solvents such as chloroform, bromoform, methylene chloride, carbon tetrachloride, 1,2-dichloroethane, 1,1,1-trichloroethane, chlorobenzene, 2,6-dichlorotoluene, and 1,1,1,3,3,3-hexafluoroisopropanol; ketone-based solvents such as acetone, methyl ethyl ketone, methyl isobutyl ketone, and methyl butyl ketone; alcohol-based solvents such as methanol, ethanol, 1-propanol, and 2-propanol; aprotic polar solvents such as N-methyl-2-pyrrolidone (NMP), dimethyl sulfoxide (DMSO), N,N-dimethylformamide (DMF), N,N-dimethylacetamide (DMA), propylene carbonate, trimethyl phosphate, 1,3-dimethyl-2-imidazolidinone, and sulfolane; carboxylic acid solvents such as formic acid, acetic acid, propionic acid, butyric acid, and lactic acid; ether-based solvents such as anisole, diethyl ether, tetrahydrofuran, diisopropyl ether, dioxane, diglyme, and dimethoxyethane; ionic liquids such as 1-butyl-3-methylimidazolium acetate, 1-butyl-3-methylimidazolium hydrogen sulfate, 1-ethyl-3-imidazolium acetate, and 1-ethyl-3-methylimidazolium thiocyanate; or any mixture thereof.

Among them, toluene, xylene, or ethyl acetate is preferable from the balance between the reaction rate and the solvent removal after reaction. In addition, the organic solvents may be used singly or in combination of two or more kinds thereof.

When the reaction is conducted in an organic solvent, the organic solvent can be removed and purified by known methods such as heating, pressure reduction, and reprecipitation. A plurality of steps may be combined to remove the organic solvent.

However, it is preferable not to use an organic solvent since productivity is improved from the viewpoint that a purification step for removing the organic solvent is not required and the production process is simple and the viewpoint that the reaction temperature can be increased and the reaction rate can be increased even in a system in which a metal catalyst as a reaction accelerator is not used.

The temperature at which the polysiloxane (A) having a functional group and the polyalkylene glycol (B) having a functional group are reacted is not particularly limited since it depends on the combination of the functional groups, but is preferably 220° C. or less, more preferably 200° C. or less, still more preferably 180° C. or less, and particularly preferably 150° C. or less to suppress side reactions and polymer decomposition. In addition, it is difficult to stably store the block copolymer at room temperature when the reaction proceeds at room temperature or less, and thus it is preferable that the reaction does not proceed at room temperature. The lower limit value of the temperature at which the reaction is conducted is preferably 50° C. or more, more preferably 70° C. or more, and still more preferably 100° C. or more.

Moreover, a reaction accelerator and the like may be added at the time of the reaction, but the intended block copolymer can be easily obtained even without adding a reaction accelerator depending on the combination of the functional group of the polysiloxane (A) with the functional group of the polyalkylene glycol (B).

As an example, when the functional group of the polysiloxane (A) is an epoxy group and the functional group of the polyalkylene glycol (B) is a hydroxyl group, examples of the reaction accelerator include sodium, sodium hydroxide, sodium methoxide, sodium ethoxide, and potassium hydroxide. When the functional group of the polysiloxane (A) is a carboxyl group and the functional group of the polyalkylene glycol (B) is a hydroxyl group, examples of the reaction accelerator include acidic metal catalysts such as titanium and zinc and catalysts such as sulfuric acid, phosphoric acid, hydrochloric acid, alumina, and zeolite. It is preferable to use a metal catalyst as a reaction accelerator to obtain a block copolymer depending on the combination of functional group copolymerization components in this manner. However, in using a metal catalyst as a reaction accelerator, for example, when the block copolymer obtained is used as various additives such as a semiconductor encapsulating material, the remaining metal catalyst may have a possibility of adversely affecting the electrical properties. As a result, it is not preferable. Hence, it is preferable that the polysiloxane (A), the polyalkylene glycol (B), and the copolymerization component (C) or (C') are reacted without using a metal catalyst as a reaction accelerator as described above.

Moreover, the reaction time depends on the combination of the functional group of the polysiloxane (A) with the functional group of the polyalkylene glycol (B) but is preferably 20 hours or less, more preferably 15 hours or less, and still more preferably 10 hours or less from the viewpoint of productivity.

The block copolymer is produced by reacting two kinds of flexible polymers, and thus the cured product can exert an effect of lowering the modulus elasticity and improving the toughness as the block copolymer is added to an epoxy resin. As the block copolymer is compatible with or finely dispersed in an epoxy resin, there is no variation in material properties, and it is possible to efficiently realize a decrease in modulus of elasticity and improvement in toughness of the cured epoxy resin and to relax the internal stress by the addition of a small amount of block copolymer. Furthermore, the block copolymer is compatible with or finely dispersed in an epoxy resin, and thus the epoxy resin composition to be obtained exhibits excellent fluidity and improved handleability.

The epoxy resin composition is a mixture of an epoxy resin to be described later and the block copolymer and refers to a mixture before being subjected to a curing reaction.

A preferred amount of the block copolymer contained in the epoxy resin composition is 0.1 to 50 parts by mass, preferably 0.1 to 40 parts by mass, more preferably 0.5 to 30 parts by mass, and still more preferably 0.5 to 20 parts by mass with respect to 100 parts by mass of the epoxy resin. As the block copolymer is contained in the epoxy resin composition in this range, the internal stress can be efficiently relaxed in the cured epoxy resin obtained by curing the epoxy resin composition.

The epoxy resin is not particularly limited, but, for example, a glycidyl ether type epoxy resin obtained from a compound having a hydroxyl group in the molecule and epichlorohydrin, a glycidylamine type epoxy resin obtained from a compound having an amino group in the molecule and epichlorohydrin, a glycidyl ester type epoxy resin obtained from a compound having a carboxyl group in the molecule and epichlorohydrin, an alicyclic epoxy resin obtained by oxidizing a compound having a double bond in the molecule, or an epoxy resin in which two or more types of groups selected from these are present together in the molecule is used.

Specific examples of the glycidyl ether type epoxy resin include bisphenol A type epoxy resin obtained by the reaction of bisphenol A with epichlorohydrin, bisphenol F type epoxy resin obtained by the reaction of bisphenol F with epichlorohydrin, bisphenol S type epoxy resin obtained by the reaction of 4,4'-dihydroxydiphenylsulfone with epichlorohydrin, biphenyl type epoxy resin obtained by the reaction of 4,4'-biphenol with epichlorohydrin, resorcinol type epoxy resin obtained by the reaction of resorcinol with epichlorohydrin, phenol novolac type epoxy resin obtained by the reaction of phenol with epichlorohydrin, in addition to these, polyethylene glycol type epoxy resin, polypropylene glycol type epoxy resin, naphthalene type epoxy resin, and regioisomers and alkyl group- and halogen-substituted products of these.

Commercially available products of bisphenol A type epoxy resin include "jER" (registered trademark) 825, "jER" (registered trademark) 826, "jER" (registered trademark) 827, and "jER" (registered trademark) 828 (all manufactured by Mitsubishi Chemical Corporation), "EPICLON" (registered trademark) 850 (manufactured by DIC Corporation), "Epotohto" (registered trademark) YD-128 (manufactured by NIPPON STEEL Chemical & material Co., Ltd.), D.E.R-331 (trademark) (manufactured by The Dow Chemical Company), and "Bakelite" (registered trademark) EPR154, "Bakelite" (registered trademark) EPR162, "Bakelite" (registered trademark) EPR172, "Bakelite" (registered trademark) EPR173, and "Bakelite" (registered trademark) EPR174 (all manufactured by Bakelite AG).

Commercially available products of bisphenol F type epoxy resin include "jER" (registered trademark) 806, "jER" (registered trademark) 807, and "jER" (registered trademark) 1750 (all manufactured by Mitsubishi Chemical Corporation), "EPICLON" (registered trademark) 830 (manufactured by DIC Corporation), "Epotohto" (registered trademark) YD-170 and "Epotohto" (registered trademark) YD-175 (manufactured by NIPPON STEEL Chemical & material Co., Ltd.), "Bakelite" (Registered trademark) EPR169 (manufactured by Bakelite AG), and "Araldite" (registered trademark) GY281, "Araldite" (registered trademark) GY282, and "Araldite" (registered trademark) GY285 (all manufactured by Huntsman Advanced Materials).

Commercially available products of biphenyl type epoxy resin include "jER" (registered trademark) YX4000, "jER" (registered trademark) YX4000K, "jER" (registered trademark) YX4000H, "jER" (registered trademark) YX4000HK, "jER" (Registered trademark) YL6121H, and "jER" (registered trademark) YL6121HN (all manufactured by Mitsubishi Chemical Corporation).

Commercially available products of resorcinol type epoxy resin include "Denacol" (registered trademark) EX-201 (manufactured by Nagase ChemteX Corporation).

Commercially available products of phenol novolac type epoxy resin include "jER" (registered trademark) 152 and "jER" (registered trademark) 154 (all manufactured by Mitsubishi Chemical Corporation), "EPICLON" (registered trademark) 740 (DIC Corporation), and EPN179 and EPN180 (all manufactured by Huntsman Advanced Materials).

Specific examples of the glycidylamine type epoxy resin include tetraglycidyldiaminodiphenylmethanes, glycidyl compounds of aminophenol, glycidylanilines, and glycidyl compounds of xylenediamine.

Commercially available products of tetraglycidyl diaminodiphenylmethanes include "SUMI-EPOXY" (registered trademark) ELM434 (manufactured by Sumitomo Chemical Co., Ltd.), "Araldite" (registered trademark) MY720, "Araldite" (registered trademark) MY721, "Araldite" (registered trademark) MY9512, "Araldite" (registered trademark) MY9612, "Araldite" (registered trademark) MY9634, and "Araldite" (registered) Trademark) MY9663 (all manufactured by Huntsman Advanced Materials), "jER" (registered trademark) 604 (manufactured by Mitsubishi Chemical Corporation), and "Bakelite" (registered trademark) EPR494, "Bakelite" (registered trademark) EPR495, "Bakelite" (registered trademark) EPR496, and "Bakelite" (registered trademark) EPR497 (all manufactured by Bakelite AG).

Commercially available products of glycidyl compounds of aminophenol include "jER" (registered trademark) 630 (manufactured by Mitsubishi Chemical Corporation), "Araldite" (registered trademark) MY0500 and "Araldite" (registered trademark) MY0510 (all manufactured by Huntsman Advanced Materials), and "SUMI-EPOXY" (registered trademark) ELM120 and "SUMI-EPOXY" (registered trademark) ELM100 (all manufactured by Sumitomo Chemical Co., Ltd.).

Commercially available products of glycidylanilines include GAN and GOT (all manufactured by Nippon Kayaku Co., Ltd.) and "Bakelite" (registered trademark) EPR493 (manufactured by Bakelite AG).

Examples of the glycidyl compounds of xylenediamine include TETRAD-X (manufactured by MITSUBISHI GAS CHEMICAL COMPANY).

Specific examples of the glycidyl ester type epoxy resin include diglycidyl phthalate, diglycidyl hexahydrophthalate, diglycidyl isophthalate, dimer acid diglycidyl ester, and various isomers thereof.

Commercially available products of diglycidyl phthalate include "EPOMIK" (registered trademark) R508 (manufactured by Mitsui Chemicals, Inc.) and "Denacol" (registered trademark) EX-721 (manufactured by Nagase ChemteX Corporation).

Commercially available products of diglycidyl hexahydrophthalate include "EPOMIK" R540 (manufactured by Mitsui Chemicals, Inc.) and AK-601 (manufactured by Nippon Kayaku Co., Ltd.).

Commercially available products of dimer acid diglycidyl ester include "jER" (registered trademark) 871 (manufactured by Mitsubishi Chemical Corporation) and "Epotohto" (registered trademark) YD-171 (manufactured by NIPPON STEEL Chemical & material Co., Ltd.).

Commercially available products of alicyclic epoxy resin include "CELLOXIDE" (registered trademark) 2021P (manufactured by DAICEL CORPORATION), CY179 (manufactured by Huntsman Advanced Materials), "CELLOXIDE" (registered trademark) 2081 (manufactured by DAICEL CORPORATION), and "CELLOXIDE" (registered trademark) 3000 (manufactured by DAICEL CORPORATION).

As the epoxy resin, biphenyl type epoxy resin, a resin selected from bisphenol A type epoxy resin, bisphenol F type epoxy resin, and bisphenol S type epoxy resin is preferable, biphenyl type epoxy resin and bisphenol A type epoxy resin is more preferable, and biphenyl type epoxy resin is still more preferable from the viewpoint of heat resistance, toughness, and low reflowability. The above epoxy resins may be used singly, or two or more kinds thereof may be used concurrently.

A curing agent and/or a curing accelerator can be added to the epoxy resin composition.

Examples of the epoxy resin curing agent include aliphatic polyamine-based curing agents such as diethylenetriamine and triethylenetriamine; alicyclic polyamine-based curing agents such as mensendiamine and isophoronediamine; aromatic polyamine-based curing agents such as diaminodiphenylmethane and m-phenylenediamine; acid anhydride-based curing agents such as polyamide, modified polyamine, phthalic anhydride, pyromellitic anhydride, and trimellitic anhydride; polyphenolic curing agents such as phenol novolac resin and phenol aralkyl resin; anionic catalysts such as polymercaptan, 2,4,6-tris(dimethylaminomethyl)phenol, 2-ethyl-4-methylimidazole, and 2-phenyl-4-methylimidazole; cationic catalysts such as boron trifluoride and monoethylamine complexes; latent curing agents such as dicyandiamide, aromatic diazonium salts, and molecular sieves.

A curing agent selected from an aromatic amine-based curing agent, an acid anhydride-based curing agent, and a polyphenolic curing agent is preferably used particularly from the viewpoint of providing a cured epoxy resin exhibiting excellent mechanical properties. A curing agent selected from phenol novolac resin and phenol aralkyl resin is particularly preferable because of excellent storage stability thereof.

Specific examples of aromatic amine-based curing agent include metaphenylenediamine, diaminodiphenylmethane, diaminodiphenylsulfone, metaxylylenediamine, diphenyl-p-dianiline, and various derivatives such as alkyl-substituted products of these and isomers of them having an amino group at different positions.

Specific examples of the acid anhydride-based curing agent include methyltetrahydrophthalic anhydride, methylhexahydrophthalic anhydride, methyl nadic anhydride, hydrogenated methyl nadic anhydride, trialkyltetrahydrophthalic anhydride, tetrahydrophthalic anhydride, hexahydrophthalic anhydride, dodecenyl succinic anhydride, and benzophenone tetracarboxylic dianhydride.

Specific examples of the polyphenolic curing agent include phenol novolac resin, phenol aralkyl resin, 1-naphthol aralkyl resin, o-cresol novolac epoxy resin, dicyclopentadiene phenol resin, terpene phenol resin, and naphthol novolac type resin.

The optimum value for the amount of curing agent added depends on the epoxy resin and the kind of curing agent, but the stoichiometric equivalent ratio of the curing agent is preferably 0.5 to 1.4 and more preferably 0.6 to 1.4 with respect to all epoxy groups contained in the epoxy resin composition. When the equivalence ratio is lower than 0.5, the curing reaction does not sufficiently occur and curing failure occurs or it takes a long time for the curing reaction in some cases. When the equivalent ratio is higher than 1.4, the curing agent not consumed at the time of curing becomes a defect and this deteriorates the mechanical properties in some instances.

The curing agent can be used in either of a monomer or oligomer form, and may be in either of a powder or liquid form at the time of mixing. These curing agents may be used singly, or two or more kinds thereof may be used concurrently. Moreover, a curing accelerator may be concurrently used.

As the curing accelerator, an amine compound-based curing accelerator typified by 1,8-diazabicyclo(5.4.0)undecene-7; imidazole compound-based curing accelerators typified by 2-methylimidazole and 2-ethyl-4-methylimidazole; phosphorus compound-based curing accelerators typified by triphenyl phosphite; and the like can be used. Among them, phosphorus compound-based curing accelerators are most preferable.

In addition to the epoxy resin and the block copolymer, various additives such as a flame retardant, a filler, a coloring agent, a release agent may be added to the epoxy resin composition if necessary.

The filler is not particularly limited, but and powders and fine particles of fused silica, crystalline silica, alumina, zircon, calcium silicate, calcium carbonate, silicon carbide, aluminum nitride, boron nitride, beryllia, zirconia and the like are used. The fillers may be used singly, or two or more kinds thereof may be used concurrently. Among them, it is preferable to use fused silica since the coefficient of linear expansion is lowered. In addition, the shape of the filler is preferably a spherical shape from the viewpoint of fluidity at the time of molding and abrasion property.

The amount of the filler blended is preferably 20 parts by mass to 2000 parts by mass, more preferably 50 to 2000 parts by mass, still more preferably 100 to 2000 parts by mass, particularly preferably 100 to 1000 parts by mass, and most preferably 500 to 800 parts by mass with respect to 100 parts by mass of the epoxy resin from the viewpoint of lowering the coefficient of moisture absorption and the coefficient of linear expansion and improving the strength.

Examples of other additives include carbon black, calcium carbonate, titanium oxide, silica, aluminum hydroxide, a glass fiber, a hindered amine-based degradation inhibitor, and a hindered phenol-based degradation inhibitor.

These additives are preferably added at a stage before the epoxy resin composition is cured, and may be added in any of a powder, liquid, or slurry form.

The epoxy resin composition exhibits favorable fluidity and excellent handleability. When the fluidity is poor, there is a risk that the epoxy resin composition cannot be filled in the fine portions and this causes the formation of voids and the damage to the package when being used in a semiconductor encapsulating material. When the block copolymer is added to an epoxy resin, an increase in viscosity due to the addition is minor and an epoxy resin composition exhibiting excellent fluidity can be obtained.

Fluidity can be evaluated by measuring the viscosity using a rheometer. Specifically, the viscosity of the epoxy resin composition not containing the block copolymer and the viscosity of an epoxy resin composition containing the block copolymer at 15 parts by mass with respect to 100 parts by mass of the epoxy resin composition are measured at 175° C. which is about the molding temperature of the semiconductor encapsulating material. When containing an epoxy resin curing agent, the viscosity of the epoxy resin composition containing the block copolymer at 15 parts by mass with respect to 100 parts by mass of the sum of the epoxy resin and the epoxy resin curing agent is measured. The fluidity is evaluated by the proportion of increase in the viscosity of the composition containing the block copolymer at 15 parts by mass with respect to that in the case of not containing the block copolymer. The upper limit of the specific proportion of increase in the viscosity is preferably 15 times or less, more preferably 13 times or less, still more preferably 10 times or less, and most preferably 8 times or less. The lower limit thereof is 1 time or more, more preferably 1.5 times or more, still more preferably 2 times or more, and most preferably 2.5 times or more. It is not preferable that the proportion of increase in the viscosity is great since the fluidity of the epoxy resin composition to be obtained is deteriorated, the epoxy resin composition cannot penetrate into the fine portions at the time of molding of the encapsulating material, and cracking is caused. Moreover, it is not preferable that the proportion of increase in the viscosity is small since the effect of lowering the modulus of elasticity and improving the toughness of the cured epoxy resin to be obtained is diminished.

The epoxy resin composition can be fabricated by adding the block copolymer to an epoxy resin and/or a curing agent and kneading the mixture using a generally known kneader. Examples of the kneader include a three-roll kneader, a rotary and revolutionary mixer, and a planetary mixer.

The cured epoxy resin is obtained by curing the epoxy resin composition described above.

To advance the curing reaction to obtain the cured epoxy resin, the temperature may be adjusted if necessary. The temperature at that time is preferably room temperature to 250° C., more preferably 50° C. to 200° C., still more preferably 70° C. to 190° C., and particularly preferably 100° C. to 180° C. Moreover, the temperature raising program may be applied if necessary. In this example, the rate of temperature rise is not particularly limited but is preferably 0.5 to 20° C./min, more preferably 0.5 to 10° C./min, and still preferably 1.0 to 5° C./min.

Moreover, the pressure at the time of curing is preferably 1 to 100 kg/cm$^2$, more preferably 1 to 50 kg/cm$^2$, still more preferably 1 to 20 kg/cm$^2$, and particularly preferably 1 to 5 kg/cm$^2$.

In the cured epoxy resin, the block copolymer is homogeneously and finely dispersed. Whether or not the block copolymer is uniformly and finely dispersed can be judged by staining the resin plate after curing with ruthenium tetroxide and confirming the cross section thereof using a photograph taken by a transmission electron microscope. The polysiloxane domain is stained in the staining with ruthenium tetroxide. It is more preferable as the average domain diameter of polysiloxane domain is finer since the toughness improving effect is further exerted. The average domain diameter of polysiloxane domain can be calculated by specifying the diameters of 100 arbitrary domains from the above photograph taken by a transmission electron microscope (TEM) and determining the arithmetic average according to Equation (1). The maximum diameter of domain is taken as the diameter when the domain does not have a perfect spherical shape.

$$Dn = (\Sigma_{i=1}^{n} R_i)/n \quad (1)$$

In Equation (1), Ri denotes the diameter of an individual domain, n denotes the number of measurements 100, and Dn denotes the average domain diameter.

The average domain diameter of polysiloxane domain determined by the present method is preferably 20 μm or less, more preferably 5 μm or less, still more preferably 1 μm or less, particularly preferably 500 nm or less, remarkably preferably 200 nm or less, and most preferably 100 nm or less.

When the measurement in a dispersed state by the above-described method is difficult, the dispersed state of the block copolymer in the cured epoxy resin can be confirmed by energy dispersive X-ray analysis (EDX). Specifically, the cross section of the cured epoxy resin to which the block copolymer is added is observed by EDX, and mapping with silicon is performed to judge the dispersed state of the block copolymer.

The semiconductor encapsulating material is composed of the cured epoxy resin. The cured epoxy resin is used as a material suitable for a semiconductor encapsulating material since the block copolymer dispersed therein functions as a stress relief agent. The semiconductor encapsulating material refers to a material for encapsulating electronic parts such as semiconductor elements so as to protect these from external stimuli.

As described above, the block copolymer is obtained by a reaction of the polysiloxane (A) having a flexible functional group with the polyalkylene glycol (B) having a functional group to be flexible and compatible with an epoxy resin and exhibits extremely excellent dispersibility in an epoxy resin since a great number of functional groups can exist in the molecule even when being prepared to have a high molecular weight. Moreover, the epoxy resin composition containing the block copolymer and an epoxy resin exhibits excellent fluidity, has a minor decrease in fluidity due to the addition of the block copolymer, and exhibits excellent handleability. Furthermore, in the cured epoxy resin obtained by curing this epoxy resin composition, the block copolymer added is finely dispersed, bleed-out is also suppressed, and not only an effect on lowering the modulus of elasticity of the cured epoxy resin but also an effect on improving the toughness of the cured epoxy resin are exerted. The block copolymer is extremely useful as a stress relief agent for epoxy resins.

EXAMPLES

Next, our copolymers, compositions, materials, products, and methods will be described in more detail with reference to Examples. This disclosure is not limited to the Examples. In Examples, the measurement methods used are as follows.

(1) Measurement of Weight Average Molecular Weight

The weight average molecular weights of the block copolymer, the polysiloxane (A) having a functional group, and the polyalkylene glycol (B) having a functional group were calculated by measuring the molecular weights by gel permeation chromatography under the following conditions and comparing the results with the calibration curves attained using polymethyl methacrylate.

Apparatus: LC-20AD Series manufactured by Shimadzu Corporation
Column: KF-806L×2 manufactured by Showa Denko K.K.
Flow rate: 1.0 mL/min
Mobile phase: tetrahydrofuran
Detection: differential refractometer
Column temperature: 40° C.

(2) Quantification of Functional Group Content

In 10 g of tetrahydrofuran, 0.5 g of a block copolymer was dissolved, and titration was conducted with 0.1 mol/L alcoholic potassium hydroxide using phenolphthalein as an indicator to quantify the carboxylic acid content.

(3) Measurement of 5% Weight Loss Temperature

The 5% weight loss temperatures of the block copolymer, the polysiloxane (A) having a functional group, and the polyalkylene glycol (B) having a functional group were measured and evaluated under the following conditions using an apparatus for thermogravimetry (Shimadzu automatic differential/thermogravimetric simultaneous measuring apparatus DTG-60 manufactured by Shimadzu Corporation).

Sample amount: 10 mg
Measurement temperature: 20° C. to 500° C.
Rate of temperature rise: 10° C./min
Atmosphere: nitrogen.

(4) Measurement of Viscosity

The viscosity of a composition in which an epoxy resin and an epoxy resin curing agent were mixed together at the mixing ratio presented in each Example was measured under the following conditions using a rheometer (MCR501 manufactured by Anton Paar GmbH), and the viscosity at 175° C. was determined. Next, the viscosity of an epoxy resin composition in which a block copolymer was added at 15 parts by mass with respect to 100 parts by mass of the sum of the same epoxy resin and epoxy resin curing agent was measured in the same manner. Magnification of the proportion of increase in the viscosity of the composition in the case of containing the block copolymer at 15 parts by mass with respect to that when not containing the block copolymer was determined.

Jig: φ25 mm parallel plate
Frequency: 0.5 Hz
Strain: 100%
Gap: 1 mm
Measurement temperature: 70° C. to 220° C.
Rate of temperature rise: 10° C./min
Atmosphere: nitrogen.

(5) Measurement of Bending Modulus of Elasticity and Strain at Break

A cured epoxy resin in which a block copolymer was dispersed was cut to have a width of 10 mm, a length of 80 mm, and a thickness of 4 mm, thereby obtaining a test piece. A three-point bending test was performed at a distance between fulcrums of 64 mm and a test speed of 2 mm/min in conformity with JIS K7171 (2008) using TENSILON universal testing machine (TENSIRON TRG-1250 manufactured by A & D Company, Limited), and the bending modulus of elasticity and the strain at break were measured. The measurement temperature was set to room temperature (23° C.), the number of measurements was set to n=5, and the average value thereof was determined.

(6) Measurement of Average Domain Diameter of Polysiloxane Domain in Cured Product A cured epoxy resin in which a block copolymer was dispersed was stained with ruthenium tetroxide, and the diameters of 100 arbitrary polysiloxane domains were measured from a photograph of the cross section taken by a transmission electron microscope and calculated according to Equation (2).

$$Dn = (\Sigma_{i=1}^{n} R_i)/n \quad (2)$$

In Equation (2), Ri denotes the diameter of an individual domain, n denotes the number of measurements 100, and Dn denotes the average domain diameter.

(7) Method of Confirming Presence or Absence of Bleed-Out

In 5 g of chloroform, 3 g of cured epoxy resin in which a block copolymer was dispersed was immersed for 1 day, then the chloroform was separated therefrom, the solvent was evaporated off from the resultant, and the mass of the block copolymer dissolved in chloroform was measured. It was evaluated that bleed-out had occurred when the mass of the block copolymer dissolved in chloroform was 5% by mass or more with respect to the mass of the block copolymer in the cured epoxy resin calculated from the composition, and it was evaluated that bleed-out had not occurred when the mass of the block copolymer dissolved is less than 5% by mass.

Production Example 1 (Synthesis 1 of Block Copolymer)

Into a 100 mL two-necked flask, 5.0 g of silicone oil having both ends modified with maleic anhydride (manufactured by Shin-Etsu Chemical Co., Ltd., X-22-168AS, weight average molecular weight: 1300, 5% weight loss temperature: 299° C.), 5.0 g of polytetramethylene glycol (manufactured by Wako Pure Chemical Industries, Ltd., polytetramethylene oxide 1,000, weight average molecular weight: 2700, 5% weight loss temperature: 275° C.), and 40 g of toluene were added, and nitrogen purging was conducted. Thereafter, the mixture was heated to 120° C. and reacted for 8 hours, and a colorless and transparent liquid was obtained. Toluene was removed from the liquid using an evaporator, and then the resultant was dried in a vacuum dryer at 80° C. for 18 hours to completely remove toluene. The block copolymer obtained was a colorless and transparent liquid, the content of a structure derived from the polysiloxane (A) was 50% by mass, the weight average molecular weight was 46,000, the 5% weight loss temperature was 309° C., and the carboxylic acid content was 1.01 mmol/g.

Production Example 2 (Synthesis 2 of Block Copolymer)

Into a 100 mL two-necked flask, 10.0 g of silicone oil having both ends modified with maleic anhydride (manufactured by Shin-Etsu Chemical Co., Ltd., X-22-168AS, weight average molecular weight: 1300, 5% weight loss temperature: 299° C.) and 10.0 g of polytetramethylene glycol (manufactured by Wako Pure Chemical Industries, Ltd., polytetramethylene oxide 1,000, weight average molecular weight: 2700, 5% weight loss temperature: 275° C.) were added, and nitrogen purging was conducted. Thereafter, the mixture was heated to 120° C. and reacted for 8 hours, and a colorless and transparent liquid was obtained. The content of a structure derived from the polysiloxane (A) in the block copolymer obtained was 50% by mass, the weight average molecular weight was 49,000, the 5% weight loss temperature was 313° C., and the carboxylic acid content was 1.01 mmol/g.

Production Example 3 (Synthesis 3 of Block Copolymer)

Into a 100 mL two-necked flask, 2.5 g of silicone oil having both ends modified with maleic anhydride (manufactured by Shin-Etsu Chemical Co., Ltd., X-22-168AS, weight average molecular weight: 1300, 5% weight loss temperature: 299° C.) and 7.5 g of polytetramethylene glycol (manufactured by Wako Pure Chemical Industries, Ltd., polytetramethylene oxide 2,900, weight average molecular weight: 12500, 5% weight loss temperature: 299° C.) were added, and nitrogen purging was conducted. Thereafter, the mixture was heated to 160° C. and reacted for 8 hours, and a colorless and transparent liquid was obtained. The content of a structure derived from the polysiloxane (A) in the block copolymer obtained was 25% by mass, the weight average molecular weight was 30,000, the 5% weight loss temperature was 325° C., and the carboxylic acid content was 0.51 mmol/g.

Production Example 4 (Synthesis 4 of Block Copolymer)

Into a 100 mL two-necked flask, 5.0 g of silicone oil having both ends modified with maleic anhydride (manufactured by Shin-Etsu Chemical Co., Ltd., X-22-168AS, weight average molecular weight: 1300, 5% weight loss temperature: 299° C.), 10.0 g of polytetramethylene glycol (manufactured by Wako Pure Chemical Industries, Ltd., polytetramethylene oxide 2,000, weight average molecular weight: 7300, 5% weight loss temperature: 293° C.), and 60 g of toluene were added, and nitrogen purging was conducted. Thereafter, the mixture was heated to 120° C. and reacted for 8 hours, and a colorless and transparent liquid was obtained. Toluene was removed from the liquid using an evaporator, and then the resultant was dried in a vacuum dryer at 80° C. for 18 hours to completely remove toluene. The block copolymer obtained was a colorless and transparent liquid, the content of a structure derived from the polysiloxane (A) was 33% by mass, the weight average molecular weight was 53,000, the 5% weight loss temperature was 311° C., and the carboxylic acid content was 0.71 mmol/g.

Production Example 5 (Synthesis 5 of Block Copolymer)

Into a 100 mL two-necked flask, 10.0 g of silicone oil having both ends modified with maleic anhydride (manufactured by Shin-Etsu Chemical Co., Ltd., X-22-168AS, weight average molecular weight: 1300, 5% weight loss temperature: 299° C.), 6.5 g of polytetramethylene glycol (manufactured by Wako Pure Chemical Industries, Ltd., polytetramethylene oxide 650, weight average molecular weight: 1600, 5% weight loss temperature: 263° C.), and 66 g of toluene were added, and nitrogen purging was conducted. Thereafter, the mixture was heated to 120° C. and reacted for 8 hours, and a colorless and transparent liquid was obtained. Toluene was removed from the liquid using an evaporator, and then the resultant was dried in a vacuum dryer at 80° C. for 18 hours to completely remove toluene. The block copolymer obtained was a colorless and transparent liquid, the content of a structure derived from the polysiloxane (A) was 61% by mass, the weight average molecular weight was 49,000, the 5% weight loss temperature was 312° C., and the carboxylic acid content was 0.68 mmol/g.

Production Example 6 (Synthesis 6 of Block Copolymer)

Into a 100 mL two-necked flask, 2.0 g of silicone oil having both ends modified with maleic anhydride (manufactured by Shin-Etsu Chemical Co., Ltd., X-22-168AS, weight average molecular weight: 1300, 5% weight loss temperature: 299° C.), 6.93 g of polytetramethylene glycol (manufactured by Wako Pure Chemical Industries, Ltd., polytetramethylene oxide 1000, weight average molecular weight: 2700, 5% weight loss temperature: 275° C.), and 1.07 g of pyromellitic dianhydride (manufactured by Tokyo Chemical Industry Co., Ltd.) were added, and nitrogen purging was conducted. Thereafter, the mixture was heated to 120° C. and reacted for 8 hours, and a block copolymer was obtained. The content of a structure derived from the polysiloxane (A) was 20% by mass, the weight average molecular weight was 106,000, the 5% weight loss temperature was 285° C., and the carboxylic acid content was 0.98 mmol/g.

Production Example 7 (Synthesis 7 of Block Copolymer)

Into a 100 mL two-necked flask, 2.0 g of silicone oil having both ends modified with maleic anhydride (manufactured by Shin-Etsu Chemical Co., Ltd., X-22-168AS, weight average molecular weight: 1300, 5% weight loss temperature: 299° C.), 6.93 g of polytetramethylene glycol (manufactured by Wako Pure Chemical Industries, Ltd., polytetramethylene oxide 1000, weight average molecular weight: 2700, 5% weight loss temperature: 275° C.), and 1.07 g of pyromellitic dianhydride (manufactured by Tokyo Chemical Industry Co., Ltd.) were added, and nitrogen purging was conducted. Thereafter, the mixture was heated to 160° C. and reacted for 3 hours, and a block copolymer was obtained. The content of a structure derived from the polysiloxane (A) was 20% by mass, the weight average molecular weight was 182,000, the 5% weight loss temperature was 289° C., and the carboxylic acid content was 0.98 mmol/g.

Production Example 8 (Synthesis 8 of Block Copolymer)

Into a 100 mL two-necked flask, 10.0 g of silicone oil having both ends modified with maleic anhydride (manufactured by Shin-Etsu Chemical Co., Ltd., X-22-168AS, weight average molecular weight: 1300, 5% weight loss temperature: 299° C.), 10.0 g of polytetramethylene glycol (manufactured by Wako Pure Chemical Industries, Ltd., polytetramethylene oxide 1000, weight average molecular weight: 2700, 5% weight loss temperature: 275° C.), and 0.2 g of succinic anhydride (manufactured by Tokyo Chemical Industry Co., Ltd.) were added, and nitrogen purging was conducted. Thereafter, the mixture was heated to 120° C. and reacted for 8 hours, and a block copolymer was obtained. The content of a structure derived from the polysiloxane (A) was 50% by mass, the weight average molecular weight was 33,000, the 5% weight loss temperature was 312° C., and the carboxylic acid content was 1.11 mmol/g.

Production Example 9 (Synthesis 9 of Block Copolymer)

Into a 100 mL separable flask, 7.5 g of silicone oil having both ends modified with a hydroxyl group (manufactured by Shin-Etsu Chemical Co., Ltd., KF-6001, weight average molecular weight: 3000, 5% weight loss temperature: 298° C.) and 6.0 g of polypropylene glycol (manufactured by Wako Pure Chemical Industries, Ltd., polypropylene glycol, diol type, 2000, weight average molecular weight: 3350, 5% weight loss temperature: 296° C.) were added to obtain a uniform solution. Next, 1.5 g of pyromellitic dianhydride (manufactured by Tokyo Chemical Industry Co., Ltd.) was added to the uniform solution, and nitrogen purging was conducted. Thereafter, the mixture was heated to 160° C. and reacted for 8 hours, and a block copolymer was obtained. The content of a structure derived from the polysiloxane (A) was 50% by mass, the weight average molecular weight was 37,000, the 5% weight loss temperature was 289° C., and the carboxylic acid content was 0.95 mmol/g.

Production Example 10 (Synthesis 10 of Block Copolymer)

Into a 100 mL separable flask, 7.5 g of silicone oil having both ends modified with a hydroxyl group (manufactured by Shin-Etsu Chemical Co., Ltd., KF-6001, weight average molecular weight: 3000, 5% weight loss temperature: 298° C.) and 6.0 g of polypropylene glycol (manufactured by Wako Pure Chemical Industries, Ltd., polypropylene glycol, diol type, 2000, weight average molecular weight: 3350, 5% weight loss temperature: 296° C.) were added to obtain a uniform solution. Next, 1.5 g of pyromellitic dianhydride (manufactured by Tokyo Chemical Industry Co., Ltd.) and 0.5 g of n-octanol (manufactured by Wako Pure Chemical Industries, Ltd.) were added to the uniform solution, and nitrogen purging was conducted. Thereafter, the mixture was heated to 160° C. and reacted for 6 hours, and a block copolymer was obtained. The content of a structure derived from the polysiloxane (A) was 48% by mass, the weight average molecular weight was 18,000, the 5% weight loss temperature was 274° C., and the carboxylic acid content was 0.80 mmol/g.

Production Example 11 (Synthesis 11 of Block Copolymer)

Into a 100 mL separable flask, 6.0 g of silicone oil having both ends modified with a hydroxyl group (manufactured by Shin-Etsu Chemical Co., Ltd., KF-6001, weight average molecular weight: 3000, 5% weight loss temperature: 298° C.) and 7.5 g of polypropylene glycol (manufactured by Wako Pure Chemical Industries, Ltd., polypropylene glycol, diol type, 2000, weight average molecular weight: 3350, 5% weight loss temperature: 296° C.) were added to obtain a uniform solution. Next, 1.5 g of pyromellitic dianhydride (manufactured by Tokyo Chemical Industry Co., Ltd.) was added to the uniform solution, and nitrogen purging was conducted. Thereafter, the mixture was heated to 160° C. and reacted for 8 hours, and a block copolymer was obtained. The content of a structure derived from the polysiloxane (A) was 40% by mass, the weight average molecular weight was 28,000, the 5% weight loss temperature was 286° C., and the carboxylic acid content was 0.93 mmol/g.

Production Example 12 (Synthesis 12 of Block Copolymer)

Into a 100 mL separable flask, 10.5 g of silicone oil having both ends modified with a hydroxyl group (manufactured by Shin-Etsu Chemical Co., Ltd., KF-6001, weight average molecular weight: 3000, 5% weight loss temperature: 298° C.) and 2.9 g of polypropylene glycol (manufactured by Wako Pure Chemical Industries, Ltd., polypropylene glycol, diol type, 2000, weight average molecular weight: 3350, 5% weight loss temperature: 296° C.) were added to obtain a uniform solution. Next, 1.6 g of pyromellitic dianhydride (manufactured by Tokyo Chemical Industry Co., Ltd.) was added to the uniform solution, and nitrogen purging was conducted. Thereafter, the mixture was heated to 160° C. and reacted for 8 hours, and a block copolymer was obtained. The content of a structure derived from the polysiloxane (A) was 70% by mass, the weight average molecular weight was 41,000, the 5% weight loss temperature was 276° C., and the carboxylic acid content was 1.01 mmol/g.

Example 1 (Production of Cured Epoxy Resin)

In a 150 cc stainless steel beaker, 9.0 g of the block copolymer obtained in Production Example 1, 38.25 g of biphenyl type epoxy resin (manufactured by Mitsubishi Chemical Corporation, "jER" (registered trademark) YX4000H) as an epoxy resin, and 21.75 g of phenol novolac type curing agent (manufactured by MEIWA PLASTIC INDUSTRIES, LTD., H-1) as a curing agent were weighed, dissolved using an oven at 120° C., and uniformly mixed. Then, 0.3 g of tetraphenylphosphonium tetra-p-tolylborate as a curing accelerator was added thereto, and the mixture was simply mixed using a stirring bar, and then mixing at 2000 rpm and 80 kPa for 1.5 minutes was conducted one time, stirring at 2000 rpm and 50 kPa for 1.5 minutes was conducted one time, and stirring at 2000 rpm and 0.2 kPa for 1.5 minutes was conducted two times using a rotary and revolutionary mixer "Awatori Rentaro" (manufactured by THINKY CORPORATION), thereby obtaining an uncured epoxy resin composition.

This uncured epoxy resin composition was cast into an aluminum mold in which a 4 mm-thick "Teflon" (registered trademark) spacer and a release film were set, and the mold was placed in an oven. The oven temperature was set to 80° C. and maintained for 5 minutes, then the temperature was raised to 175° C. at a rate of temperature rise of 1.5° C./min, and curing was conducted for 4 hours, thereby obtaining a cured epoxy resin having a thickness of 4 mm.

The cured epoxy resin obtained was cut to have a width of 10 mm and a length of 80 mm and subjected to a three-point bending test in conformity with JIS K7171 (2008) using TENSILON universal testing machine (TENSILON TRG-1250 manufactured by A & D Company, Limited), and the bending modulus of elasticity and the strain at break were measured, as a result, the bending modulus of elasticity was 2.5 GPa and the strain at break was 13%. The uncured epoxy resin composition was finely dispersed, the viscosity thereof was 0.125 Pa·s, the proportion of increase in the viscosity was 5.2 times, and the average domain diameter of polysiloxane in the cured product was 50 nm. Furthermore, the occurrence of bleed-out was confirmed. As a result, irregularities were not observed, the soluble matter was 0.7%, and bleed-out had not occurred. The results are presented in Table 1.

TABLE 1

|  | Additive | Content of structure derived from (A) in block copolymer (%) | Bending modulus of elasticity (GPa) | Strain at break (%) | Proportion of increase in viscosity (times) | Bleed-out | Average domain diameter of polysiloxane (nm) |
|---|---|---|---|---|---|---|---|
| Example 1 | Block copolymer obtained in Production Example 1 | 50 | 2.5 | 13 | 5.2 | Absence | 50 |
| Example 2 | Block copolymer obtained in Production Example 2 | 50 | 2.5 | 11 | 5.8 | Absence | 53 |
| Example 3 | Block copolymer obtained in Production Example 4 | 33 | 2.4 | 15 | 4.4 | Absence | 40 |
| Example 4 | Block copolymer obtained in Production Example 5 | 61 | 2.4 | 11 | 2.7 | Absence | 65 |
| Example 5 | Block copolymer obtained in Production Example 6 | 20 | 3.0 | 12 | 14.8 | Absence | 60 |
| Example 6 | Block copolymer obtained in Production Example 8 | 50 | 2.6 | 15 | 2.5 | Absence | 63 |
| Example 7 | Block copolymer obtained in Production Example 9 | 50 | 2.3 | 10 | 4.3 | Absence | 51 |
| Example 8 | Block copolymer obtained in Production Example 10 | 48 | 2.5 | 12 | 3.0 | Absence | 80 |
| Example 9 | Block copolymer obtained in Production Example 11 | 40 | 2.4 | 10 | 3.6 | Absence | 60 |
| Example 10 | Block copolymer obtained in Production Example 12 | 70 | 2.0 | 13 | 3.1 | Absence | 163 |
| Comparative Example 1 | Silicone oil | — | 2.6 | 5.7 | 1.3 | Absence | 100000 |
| Comparative Example 2 | Polytetramethylene oxide 1,000 | — | 3.4 | 8.3 | 0.9 | Presence | — |
| Comparative Example 3 | Silicone oil | — | — | — | 1.2 | Presence | — |

TABLE 1-continued

| | Additive | Content of structure derived from (A) in block copolymer (%) | Bending modulus of elasticity (GPa) | Strain at break (%) | Proportion of increase in viscosity (times) | Bleed-out | Average domain diameter of polysiloxane (nm) |
|---|---|---|---|---|---|---|---|
| Comparative Example 4 | Silicone particles | — | 2.3 | 7.2 | 20.4 | — | 10000 |
| Comparative Example 5 | — | — | 2.9 | 9.5 | — | — | — |

Example 2 (Production of Cured Epoxy Resin 2)

Figure 1:
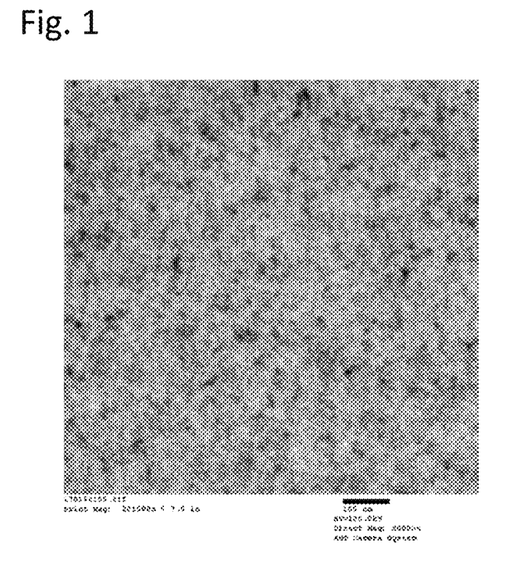
FIG. 1 is a cross-sectional TEM image of a cured epoxy resin obtained in Example 2.

A cured epoxy resin was obtained in the same manner as in Example 1 except that the block copolymer was replaced with 9.0 g of the block copolymer obtained in Production Example 2. Bleed-out had not occurred, and the bending modulus of elasticity and the strain at break of the cured epoxy resin obtained were measured. As a result, the bending modulus of elasticity was 2.5 GPa and the strain at break was 11%. In addition, the uncured epoxy resin composition was finely dispersed, the viscosity thereof was 0.139 Pa·s, the proportion of increase in the viscosity was 5.8 times, and the average domain diameter of polysiloxane in the cured product was 53 nm (FIG. 1), the soluble matter was 0.2%, and bleed-out had not occurred. The results are presented in Table 1.

Example 3 (Production of Cured Epoxy Resin 3)

A cured epoxy resin was obtained in the same manner as in Example 1 except that the block copolymer was replaced with 9.0 g of the block copolymer obtained in Production Example 4. Bleed-out had not occurred, and the bending modulus of elasticity and the strain at break of the cured epoxy resin obtained were measured. As a result, the bending modulus of elasticity was 2.4 GPa and the strain at break was 15%. In addition, the uncured epoxy resin composition was finely dispersed, the viscosity thereof was 0.106 Pa·s, the proportion of increase in the viscosity was 4.4 times, and the average domain diameter of polysiloxane in the cured product was 40 nm, the soluble matter was 0.5%, and bleed-out had not occurred. The results are presented in Table 1.

Example 4 (Production of Cured Epoxy Resin 4)

A cured epoxy resin was obtained in the same manner as in Example 1 except that the block copolymer was replaced with 9.0 g of the block copolymer obtained in Production Example 5. Bleed-out had not occurred, and the bending modulus of elasticity and the strain at break of the cured epoxy resin obtained were measured. As a result, the bending modulus of elasticity was 2.4 GPa and the strain at break was 11%. In addition, the uncured epoxy resin composition was finely dispersed, the viscosity thereof was 0.064 Pa·s, the proportion of increase in the viscosity was 2.7 times, and the average domain diameter of polysiloxane in the cured product was 65 nm, the soluble matter was 1.2%, and bleed-out had not occurred. The results are presented in Table 1.

Example 5 (Production of Cured Epoxy Resin 5)

A cured epoxy resin was obtained in the same manner as in Example 1 except that the block copolymer was replaced with 9.0 g of the block copolymer obtained in Production Example 6. Bleed-out had not occurred, and the bending modulus of elasticity and the strain at break of the cured epoxy resin obtained were measured. As a result, the bending modulus of elasticity was 3.0 GPa and the strain at break was 12%. In addition, the uncured epoxy resin composition was finely dispersed, the viscosity thereof was 0.356 Pa·s, the proportion of increase in the viscosity was 14.8 times, and the average domain diameter of polysiloxane in the cured product was 60 nm, the soluble matter was 0.2%, and bleed-out had not occurred. The results are presented in Table 1.

Example 6 (Production of Cured Epoxy Resin 6)

A cured epoxy resin was obtained in the same manner as in Example 1 except that the block copolymer was replaced with 9.0 g of the block copolymer obtained in Production Example 8. Bleed-out had not occurred, and the bending modulus of elasticity and the strain at break of the cured epoxy resin obtained were measured. As a result, the bending modulus of elasticity was 2.6 GPa and the strain at break was 15%. In addition, the uncured epoxy resin composition was finely dispersed, the viscosity thereof was 0.06 Pa·s, the proportion of increase in the viscosity was 2.5 times, and the average domain diameter of polysiloxane in the cured product was 63 nm, the soluble matter was 0.5%, and bleed-out had not occurred. The results are presented in Table 1.

Example 7 (Production of Cured Epoxy Resin 7)

Figure 2:
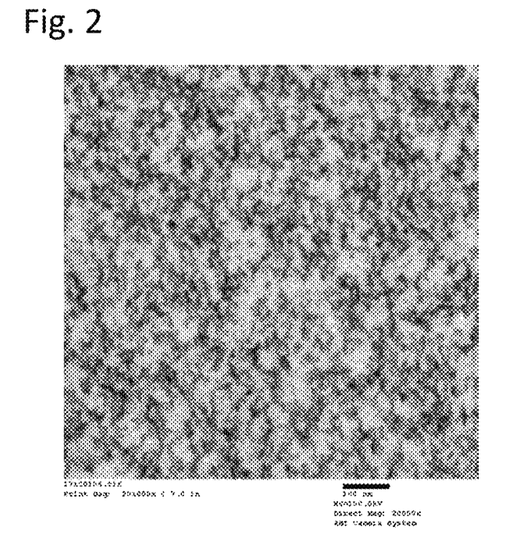
FIG. 2 is a cross-sectional TEM image of a cured epoxy resin obtained in Example 7.

A cured epoxy resin was obtained in the same manner as in Example 1 except that the block copolymer was replaced with 9.0 g of the block copolymer obtained in Production Example 9. Bleed-out had not occurred, and the bending modulus of elasticity and the strain at break of the cured epoxy resin obtained were measured. As a result, the bending modulus of elasticity was 2.3 GPa and the strain at break was 10%. In addition, the uncured epoxy resin composition was finely dispersed, the viscosity thereof was 0.104 Pa·s, the proportion of increase in the viscosity was 4.3 times, and the average domain diameter of polysiloxane in the cured product was 51 nm (FIG. 2), the soluble matter was 0.2%, and bleed-out had not occurred. The results are presented in Table 1.

Example 8 (Production of Cured Epoxy Resin 8)

A cured epoxy resin was obtained in the same manner as in Example 1 except that the block copolymer was replaced with 9.0 g of the block copolymer obtained in Production Example 10. Bleed-out had not occurred, and the bending modulus of elasticity and the strain at break of the cured epoxy resin obtained were measured. As a result, the bending modulus of elasticity was 2.5 GPa and the strain at break was 12%. In addition, the uncured epoxy resin composition was finely dispersed, the viscosity thereof was 0.072 Pa·s, the proportion of increase in the viscosity was 3.0 times, and the average domain diameter of polysiloxane in the cured product was 80 nm, the soluble matter was 0.8%, and bleed-out had not occurred. The results are presented in Table 1.

Example 9 (Production of Cured Epoxy Resin 9)

A cured epoxy resin was obtained in the same manner as in Example 1 except that the block copolymer was replaced with 9.0 g of the block copolymer obtained in Production Example 11. Bleed-out had not occurred, and the bending modulus of elasticity and the strain at break of the cured epoxy resin obtained were measured. As a result, the bending modulus of elasticity was 2.4 GPa and the strain at break was 10%. In addition, the uncured epoxy resin composition was finely dispersed, the viscosity thereof was 0.087 Pa·s, the proportion of increase in the viscosity was 3.6 times, and the average domain diameter of polysiloxane in the cured product was 60 nm, the soluble matter was 1.0%, and bleed-out had not occurred. The results are presented in Table 1.

Example 10 (Production of Cured Epoxy Resin 10)

A cured epoxy resin was obtained in the same manner as in Example 1 except that the block copolymer was replaced with 9.0 g of the block copolymer obtained in Production Example 12. Bleed-out had not occurred, and the bending modulus of elasticity and the strain at break of the cured epoxy resin obtained were measured. As a result, the bending modulus of elasticity was 2.0 GPa and the strain at break was 13%. In addition, the uncured epoxy resin composition was finely dispersed, the viscosity thereof was 0.075 Pa·s, the proportion of increase in the viscosity was 3.1 times, and the average domain diameter of polysiloxane in the cured product was 163 nm, the soluble matter was 0.8%, and bleed-out had not occurred. The results are presented in Table 1.

Comparative Example 1

A cured epoxy resin was fabricated in the same manner as in Example 1 except that the block copolymer was replaced with 9.0 g of silicone oil having both ends modified with maleic anhydride (manufactured by Shin-Etsu Chemical Co., Ltd., X-22-168AS, weight average molecular weight: 1300, 5% weight loss temperature: 299° C.). A three-point bending test was conducted using the cured epoxy resin obtained. As a result, the bending modulus of elasticity was 2.6 GPa and the strain at break was 5.7%. In addition, the uncured epoxy resin composition was separated into two phases, the viscosity thereof was 0.032 Pa·s, the proportion of increase in the viscosity was 1.3 times, and the average domain diameter of polysiloxane in the cured product was 100 μm to be coarse, the soluble matter was 0.3%, and bleed-out had not occurred. The results are presented in Table 1.

Comparative Example 2

A cured epoxy resin was fabricated in the same manner as in Example 1 except that the block copolymer was replaced with 9.0 g of polytetramethylene glycol (manufactured by Wako Pure Chemical Industries, Ltd., polytetramethylene oxide 1,000, weight average molecular weight: 2700, 5% weight loss temperature: 275° C.). The presence or absence of bleed-out was confirmed, as a result, the soluble matter was 7%, and bleed-out had occurred. A three-point bending test was conducted using the cured epoxy resin obtained. As a result, the bending modulus of elasticity was 3.4 GPa and the strain at break was 8.3%. In addition, the uncured epoxy resin composition was finely dispersed, the viscosity thereof was 0.021 Pa·s, the proportion of increase in the viscosity was 0.9 times, and the soluble matter in the cured product was 11.0%, and bleed-out had occurred. The results are presented in Table 1.

Comparative Example 3

A cured epoxy resin was fabricated in the same manner as in Example 1 except that the block copolymer was replaced with 9.0 g of polydimethylsiloxane (manufactured by Shin-Etsu Chemical Co., Ltd., KF-96-200cs, weight average molecular weight: 18000, carboxylic acid content: 0 mmol/g). The presence or absence of bleed-out was confirmed. As a result, a great number of perfect spherical irregularities were observed, the soluble matter was 46%, bleed-out had occurred and, thus it was not possible to conduct a bending test. In addition, the uncured epoxy resin composition was separated into two phases, the viscosity thereof was 0.029 Pa·s, and the proportion of increase in the viscosity was 1.2 times. The results are presented in Table 1.

Comparative Example 4

A cured epoxy resin was fabricated in the same manner as in Example 1 except that the block copolymer was replaced with 9.0 g of silicone particles ("TREFIL" (registered trademark) EP2601 manufactured by Dow Corning Toray Co., Ltd.). A three-point bending test was conducted using the cured epoxy resin obtained. As a result, the bending modulus of elasticity was 2.3 GPa and the strain at break was 7.2%. In addition, the uncured epoxy resin composition was separated into silicone particles and an epoxy composition, the viscosity thereof was 0.49 Pa·s, the proportion of increase in the viscosity was 20.4 times, and the average domain diameter of polysiloxane in the cured product was 10 μm. The results are presented in Table 1

Comparative Example 5

A cured epoxy resin was fabricated in the same manner as in Example 1 except that a block copolymer was not blended. A three-point bending test was conducted using the cured epoxy resin obtained. As a result, the bending modulus of elasticity was 2.9 GPa and the strain at break was 9.5%. In addition, the viscosity of the uncured epoxy resin composition was 0.024 Pa·s. The results are presented in Table 1.

The invention claimed is:

1. A polysiloxane-polyalkylene glycol block copolymer obtained by reacting a polysiloxane (A) having any functional group selected from a carboxylic anhydride group, a hydroxyl group, and an epoxy group with a polyalkylene glycol (B) having any functional group selected from a carboxylic anhydride group, a hydroxyl group, and an epoxy group, wherein the functional group of one of the polysiloxane (A) or the polyalkylene glycol (B) is a carboxylic anhydride group and the functional group of the other is a hydroxyl group, or the functional group of one of the polysiloxane (A) or the polyalkylene glycol (B) is an epoxy group and the functional group of the other is a hydroxyl group, or both the functional group of the polysiloxane (A) and the functional group of the polyalkylene glycol (B) are a hydroxyl group, and the polysiloxane (A), the polyalkylene glycol (B), and a copolymerization component (C') in which both ends are carboxylic anhydride groups are reacted with one another, wherein a content of a structure derived from the polysiloxane (A) is 20% by mass or more and 90% by mass or less with respect to 100% by mass of the polysiloxane-polyalkylene glycol block copolymer, and wherein a functional group content in the polysiloxane-polyalkylene glycol block copolymer is 0.1 mmol/g to 3.0 mmol/g, and the functional group is a group selected from a group consisting of a carboxyl group and a hydroxyl group.

2. The polysiloxane-polyalkylene glycol block copolymer according to claim 1, wherein the polysiloxane (A) is represented by Formula (1):

(1)

wherein Xs denote any functional group selected from a carboxylic anhydride group, a hydroxyl group, and an epoxy group, and may be the same as or different from one another; $R^1$s denote a hydrogen atom, an alkyl group having 1 to 5 carbon atoms, or a phenyl group, and may be the same as or different from one another; $R^2$s denote a single bond or a divalent aliphatic or aromatic hydrocarbon group having 1 to 10 carbon atoms or a divalent hydrocarbon ether group having 2 to 10 carbon atoms, and may be the same as or different from one another; and n denotes a number of repeating units from 5 to 100.

3. The polysiloxane-polyalkylene glycol block copolymer according to claim 1, wherein the polyalkylene glycol (B) is represented by Formula (2):

(2)

wherein Ys denote any functional group selected from a carboxylic anhydride group, a hydroxyl group, and an epoxy group, and may be the same as or different from one another; $R^3$s denote a linear or branched alkyl group having 2 to 10 carbon atoms, and may be the same as or different from one another; and m denotes a number of repeating units from 3 to 300.

4. The polysiloxane-polyalkylene glycol block copolymer according to claim 1, wherein a weight average molecular weight of the polysiloxane-polyalkylene glycol block copolymer is 5,000 to 500,000.

5. The polysiloxane-polyalkylene glycol block copolymer according to claim 1, comprising a structure derived from a copolymerization component (C') having one or more functional groups to react with both of a functional group of the polysiloxane (A) and a functional group of the polyalkylene glycol (B).

6. The polysiloxane-polyalkylene glycol block copolymer according to claim 1, wherein the polyalkylene glycol (B) is polytetramethylene glycol and/or polypropylene glycol.

7. The polysiloxane-polyalkylene glycol block copolymer according to claim 1, wherein the polysiloxane (A) has a carboxylic anhydride group and/or a hydroxyl group.

8. A method of producing the polysiloxane-polyalkylene glycol block copolymer as set forth in claim 1, comprising:

reacting a polysiloxane (A) having any functional group selected from a carboxylic anhydride group, a hydroxyl group, and an epoxy group, with a polyalkylene glycol (B) having any functional group selected from a carboxylic anhydride group, a hydroxyl group, and an epoxy group, and, wherein the functional group of one of the polysiloxane (A) or the polyalkylene glycol (B) is a carboxylic anhydride group and the functional group of the other is a hydroxyl group, or the functional group of one of the polysiloxane (A) or the polyalkylene glycol (B) is an epoxy group and the functional group of the other is a hydroxyl group, or both the functional group of the polysiloxane (A) and the functional group of the polyalkylene glycol (B) are a hydroxyl group, and the polysiloxane (A), the polyalkylene glycol (B), and a copolymerization component (C') in which both ends are carboxylic anhydride groups are reacted with one another, wherein an amount of the polysiloxane (A) is 20% by mass or more and 90% by mass or less with respect to 100% by mass of a sum of the polysiloxane (A), the polyalkylene glycol (B), and the copolymerization component (C').

9. The method according to claim 8, wherein the polysiloxane (A), the polyalkylene glycol (B), and a copolymerization component (C') which reacts with both a functional group of the polysiloxane (A) and a functional group of the polyalkylene glycol (B) are reacted with one another.

10. The method according to claim 8, wherein the polysiloxane (A), the polyalkylene glycol (B), and the copolymerization component (C') are reacted without using a metal catalyst which is a reaction accelerator.

11. An epoxy resin composition comprising the polysiloxane-polyalkylene glycol block copolymer according to claim 1 and an epoxy resin.

12. A cured epoxy resin comprising the epoxy resin composition according to claim 11 that has been cured.

13. A semiconductor encapsulating material comprising the cured epoxy resin according to claim 12.

* * * * *